(12) United States Patent
Pressman et al.

(10) Patent No.: US 12,358,371 B2
(45) Date of Patent: Jul. 15, 2025

(54) MONITORING SYSTEM FOR AN ENERGY STORAGE APPARATUS

(71) Applicant: Transportation IP Holdings, LLC, Norwalk, CT (US)

(72) Inventors: Jacob Pressman, Erie, PA (US); Ajith Kuttannair Kumar, Erie, PA (US); Neil Burkell, Erie, PA (US); Patrick Lee Jansen, Erie, PA (US); Bret Worden, Erie, PA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 456 days.

(21) Appl. No.: 17/490,958

(22) Filed: Sep. 30, 2021

(65) Prior Publication Data

US 2022/0289030 A1    Sep. 15, 2022

Related U.S. Application Data

(60) Provisional application No. 63/160,582, filed on Mar. 12, 2021.

(51) Int. Cl.
*B60L 3/00*       (2019.01)
*B60L 58/22*      (2019.01)
(Continued)

(52) U.S. Cl.
CPC .............. *B60L 3/0046* (2013.01); *B60L 58/22* (2019.02); *B60L 58/26* (2019.02); *G01R 31/006* (2013.01);
(Continued)

(58) Field of Classification Search
CPC ........ B60L 3/0046; B60L 58/22; B60L 58/26; B60L 2240/545; G01R 31/374;
(Continued)

(56) References Cited

U.S. PATENT DOCUMENTS 6,349,248 B1    2/2002 Dean et al.
7,598,712 B2 *  10/2009 Zettel .................... G01R 31/374
                                                     320/132

(Continued)

FOREIGN PATENT DOCUMENTS

JP    2015037015 A    2/2015
JP    2021036485 A    3/2021

OTHER PUBLICATIONS

Examination Report mailed Oct. 17, 2022 for corresponding Indian Patent Application No. 202114046156 (5 pages).

*Primary Examiner* — Raul J Rios Russo
*Assistant Examiner* — Trung Q Nguyen
(74) *Attorney, Agent, or Firm* — K&L Gates LLP

(57) ABSTRACT

A system and method determine (a) thermal characteristics of an energy storage apparatus that supplies electric current to one or more vehicular loads for powering the one or more vehicular loads and/or (b) electrical characteristics of the energy storage apparatus or the one or more vehicular loads. The system and method determine whether operation of the energy storage apparatus indicates that the energy storage apparatus is unexpectedly heating or unexpectedly cooling and identifying a fault in the energy storage apparatus responsive to determining that the energy storage apparatus is unexpectedly heating or unexpectedly cooling.

19 Claims, 14 Drawing Sheets

(51) Int. Cl.
  *B60L 58/26* (2019.01)
  *G01R 31/00* (2006.01)
  *G01R 31/374* (2019.01)
  *G01R 31/396* (2019.01)
  *H01M 10/48* (2006.01)
  *H02J 7/00* (2006.01)

(52) U.S. Cl.
  CPC ......... *G01R 31/374* (2019.01); *G01R 31/396* (2019.01); *H01M 10/482* (2013.01); *H01M 10/486* (2013.01); *H02J 7/0048* (2020.01); *H02J 7/005* (2020.01); *B60L 2240/545* (2013.01); *H01M 2200/10* (2013.01); *H01M 2220/20* (2013.01)

(58) Field of Classification Search
  CPC ... G01R 31/396; G01R 31/006; H02J 7/0048; H02J 7/005; H01M 10/482; H01M 10/486; H01M 2200/10; H01M 2220/20
  USPC .... 324/96, 400, 430–433, 500, 600, 764.01, 324/103 R, 771, 761.01, 501, 639, 642, 324/702, 76.11, 76.66
  See application file for complete search history.

(56) References Cited

U.S. PATENT DOCUMENTS

| | | | |
|---|---|---|---|
| 10,598,650 | B2 | 3/2020 | Worden et al. |
| 10,741,889 | B2 * | 8/2020 | Newman ............ H01M 10/4207 |
| 11,360,154 | B1 * | 6/2022 | Shields ................ G01R 31/392 |
| 2015/0194711 | A1 * | 7/2015 | Rawlinson ......... B60H 1/00278 429/62 |
| 2019/0198937 | A1 * | 6/2019 | Jung ................. H01M 10/4285 |
| 2020/0076007 | A1 * | 3/2020 | Jeon ..................... H01M 50/569 |
| 2020/0319259 | A1 * | 10/2020 | Pressman ............. G05B 19/042 |
| 2021/0211067 | A1 | 7/2021 | Kumar et al. |

* cited by examiner

MONITORING SYSTEM FOR AN ENERGY STORAGE APPARATUS

CROSS-REFERENCE TO RELATED APPLICATIONS

This application claims priority to U.S. Provisional Patent Application No. 63/160,582 (filed 12 Mar. 2021), the entire disclosure of which is incorporated herein by reference.

BACKGROUND

Technical Field

The subject matter described herein relates to monitoring systems that monitor operation of energy storage apparatuses to detect potential failures or needs for repair, inspection, replacement, or the like.

Discussion of Art

Various powered systems may be powered by electric current received from energy storage apparatuses. For example, vehicles may be powered to move along routes, to power auxiliary loads, etc., by batteries onboard the vehicles. The energy storage apparatuses may include many (e.g., thousands) of current-carrying joints between conductive components. These joints may include bolts, welds, or the like. As one example, a battery electric locomotive (BEL), electric vehicle (EV), or the like, may have battery cells welded in series or parallel, battery stacks that include several cells (with the stacks bolted with each other), battery modules that include several battery stacks (with the modules bolted together), etc. The battery cells and the joints between or among the cells, stacks, and modules may be failure locations for battery apparatuses, but may be difficult to detect given the large number of potential failure locations.

Failure of a cell and/or current-carrying joint may be detrimental to the entire system. In vehicular applications, the apparatuses may experience large impacts due to travel, coupling and decoupling of a vehicle with another vehicle, etc. These and other forces may loosen poor connections and may cause a loose component that is at a battery potential to make contact with or near ground potential which may eventually lead to a thermal event. Current flow through a poor electrical joint may also lead to excessive heating and a potential thermal event.

Not all unexpected heating comes from a poor joint, however. Unexpected heating may come from a failed thermal management circuit (e.g., a cooling system that directs coolant along conduits forming the thermal management circuit) or from the battery cells. Some failure modes may also yield unexpected cooling. Early detection of a cell failure may prevent a thermal event from occurring. But, the large number of cells and/or joints may make early detection extremely difficult.

BRIEF DESCRIPTION

In one embodiment, a method is provided that includes determining at least one of (a) one or more thermal characteristics of an energy storage apparatus that supplies electric current to one or more vehicular loads for powering the one or more vehicular loads and/or (b) one or more electrical characteristics of the energy storage apparatus or the one or more vehicular loads. The method also includes determining whether operation of the energy storage apparatus indicates that the energy storage apparatus is unexpectedly heating or unexpectedly cooling and identifying a fault in the energy storage apparatus responsive to determining that the energy storage apparatus is unexpectedly heating or unexpectedly cooling.

In one embodiment, a method includes determining a first temperature of a first battery cell group formed from a first group of one or more battery cells connected with each other, determining a second temperature of at least a second battery cell group formed from a second group of one or more battery cells connected in parallel with each other, determining whether one or more of the first temperature or a rate of change of the first temperature of the first battery cell group exceeds a first threshold and one or more of the second temperature or a rate of change of the second temperature of the second battery cell group exceeds a second threshold, and, responsive to determining that either the first temperature of the first battery cell group exceeds the first threshold or the second temperature of the second battery cell group exceeds the second threshold, identifying a thermal runaway of the first module in the module string.

In one embodiment, a method includes determining whether a first temperature increase in a first group of battery cells of an energy storage apparatus onboard a vehicle is greater than a first threshold, determining whether a temperature rise differential between a first battery cell of the battery cells in the first group and one or more other battery cells of the battery cells in the first group, determining whether the temperature rise differential is greater than a second threshold, determining whether at least a second temperature increase of at least a second battery cell in at least a second group of the battery cells is greater than a third threshold (where the first battery cell and the at least the second battery cell are each located in the same position within each of the first group of the battery cells and the at least the second group of the battery cells), and determining that a thermal runaway has occurred or is occurring within the energy storage apparatus responsive to the first temperature increase exceeding the first threshold, the temperature differential exceeds the second threshold, and the second temperature increase exceeds the third threshold.

In one embodiment, a method includes measuring one or more of a temperature, resistance, or voltage at or within a designated distance of a coupling between an energy storage apparatus that supplies electric current to one or more vehicular loads for powering the one or more vehicular loads, and determining a failure of the coupling based on the one or more of the temperature, the resistance, or the voltage that is measured.

In one embodiment, a method includes pulsing one or more of a current or a voltage through one or more couplings between components of an energy storage apparatus, determining a change in resistance of the one or more couplings, and determining that the one or more couplings are one or more of loose or damaged based on the change in resistance of the one or more couplings.

In one or more embodiments, a sensor may disposed on or near a coupling of the energy storage apparatus and may sense both a temperature of a battery cell of the energy storage apparatus and a temperature of the coupling. The sensor may be disposed near the coupling by the sensor being closer to the coupling than the battery cell. The sensor may not be disposed on the battery cell.

BRIEF DESCRIPTION OF THE DRAWINGS

The inventive subject matter may be understood from reading the following description of non-limiting embodiments, with reference to the attached drawings, wherein below.

DETAILED DESCRIPTION

One or more embodiments of the inventive subject matter described herein includes monitoring systems and methods that monitor operation of an energy storage apparatus. The monitoring systems and methods may use sensor measurements and/or parameter estimations to detect unexpected behavior in the energy storage apparatus. These measurements or estimations may be obtained during normal operation of a powered system that is powered by the energy storage apparatus (e.g., a vehicle or stationary load), during static operation of the powered system (e.g., while a vehicle is idling), and/or during induced situation tests (e.g., where the vehicle or load is placed into a desired situation). One example of a model that may be used to detect unexpected behavior combines sensor measurements and parameter estimations and where all of the known sources of watts in the powered system (e.g., the vehicle or other load) should explain or correspond with a total temperature change for the energy storage apparatus. If the temperature change does not match the expected behavior from all of the known sources, then there is unexpected heating or cooling in the energy storage apparatus or the powered system. Other logic and comparisons across similar measurements and/or estimated (or calculated) parameters may determine whether this additional source of watts or unexplained temperature change is a result of a failed cell assembly, thermal circuit, electrical joint, or the like.

Increased reliability comes as a result of this failure detection as these types of failures may lead to secondary damage if left undetected. With thousands of current carrying joints, cell assemblies, and various components that rely on a thermal management circuit of the powered system, early failure detection may be helpful to prevent prolonged use which leads to degrading lives of the components such as the battery cells, as well as prevent secondary damage to other components of the powered systems from failures.

Figure 1:
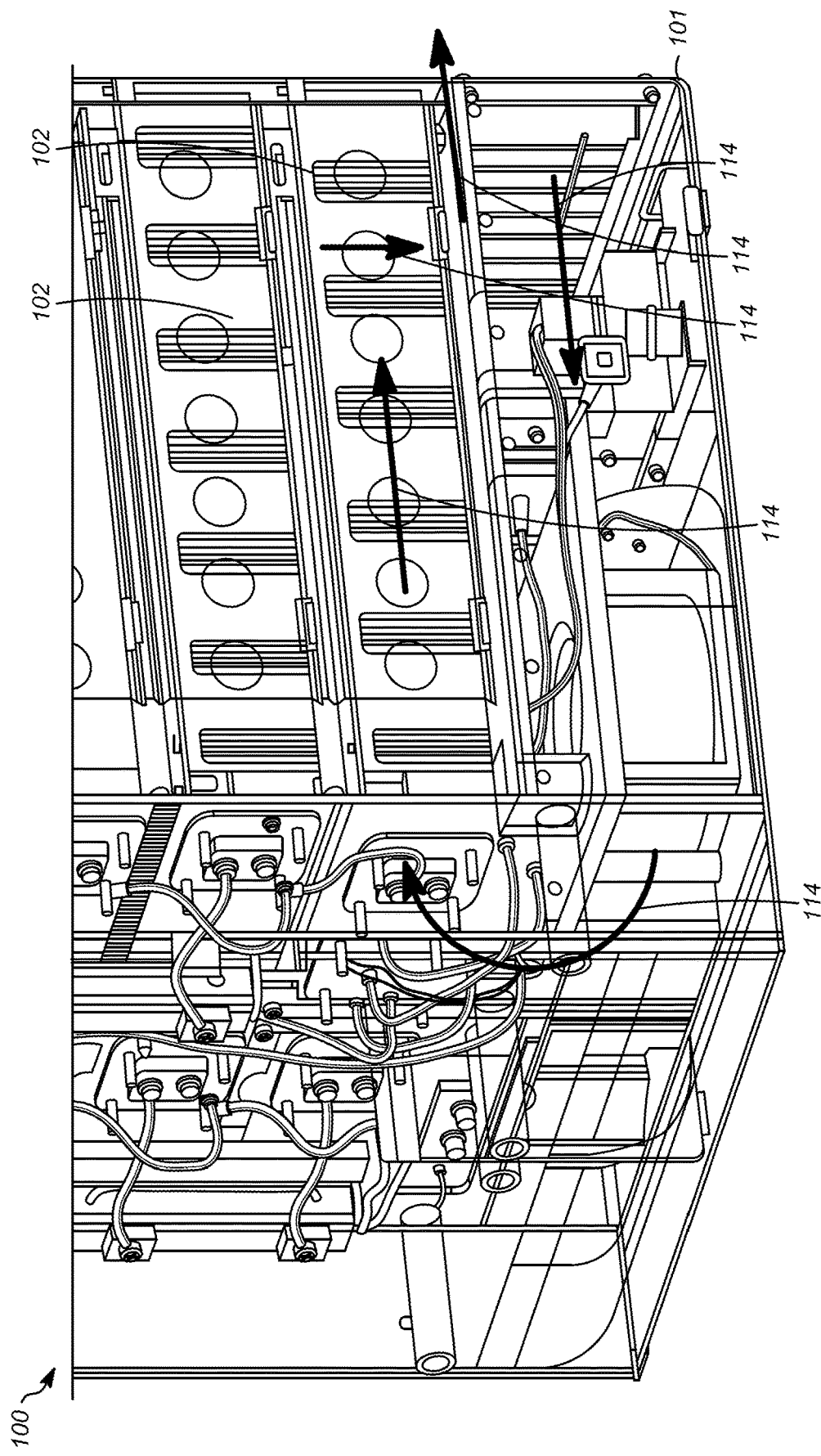
FIG. 1 illustrates one example of an energy storage apparatus.
Figure 2:
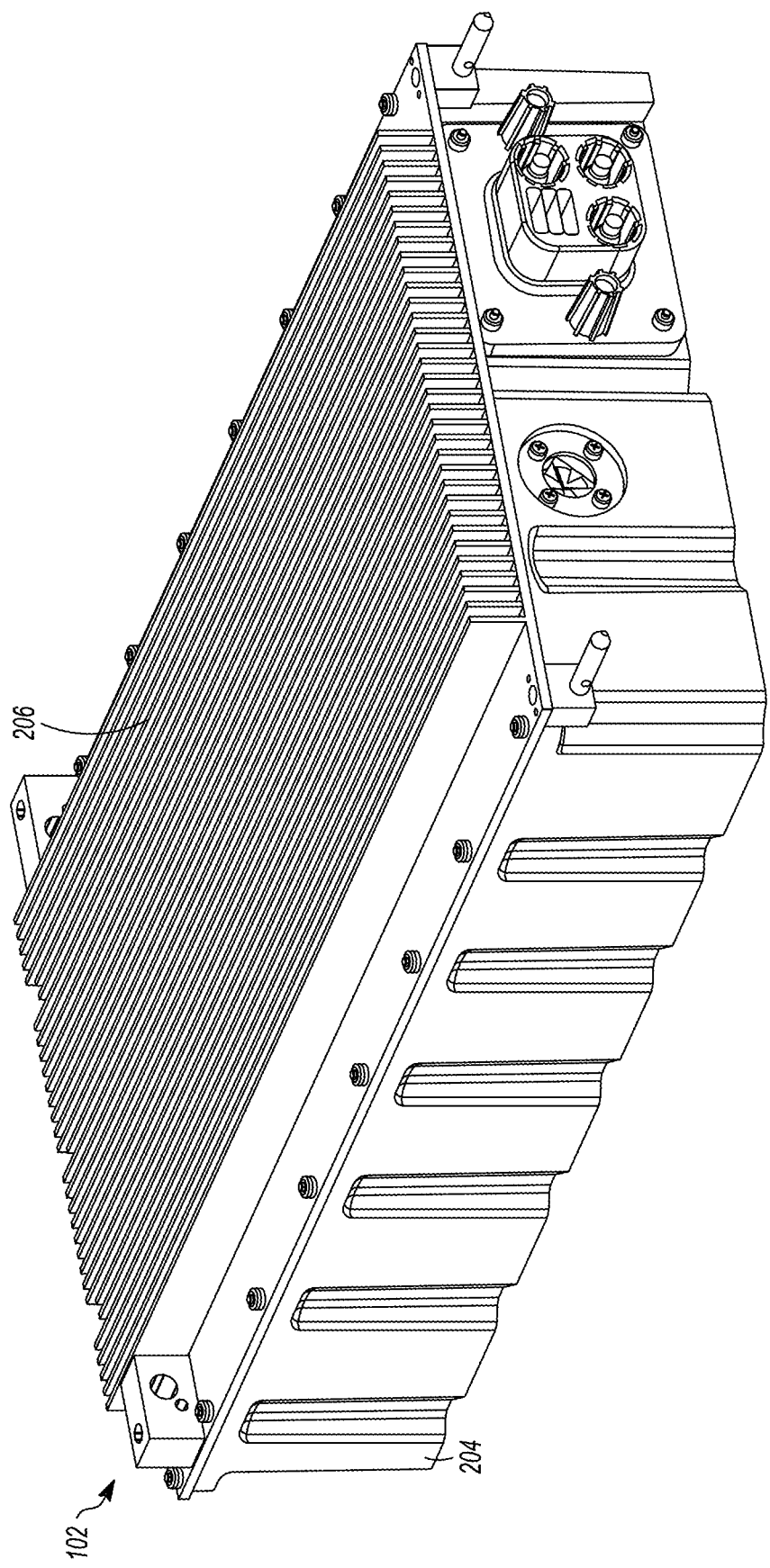
FIG. 2 illustrates one example of an energy storage module in the energy storage apparatus shown in FIG. 1.

FIG. 1 illustrates one example of an energy storage apparatus 100. The energy storage apparatus has an external housing 101 with several energy storage modules 102 inside the external housing. FIG. 2 illustrates one example of one of the energy storage modules in the energy storage apparatus shown in FIG. 1. The energy storage module includes an exterior housing 204 with a thermal management apparatus 206 disposed on, coupled with, and/or integrally formed with the housing. The thermal management apparatus may include a heat sink that includes several heat fins that dissipate heat from the module via a thermal management circuit 114 in the energy storage apparatus (described below). Optionally, the thermal management apparatus may include one or more devices that move a fluid coolant, such as fans that blow cooling air, pumps that move a liquid coolant, etc.

Figure 3:
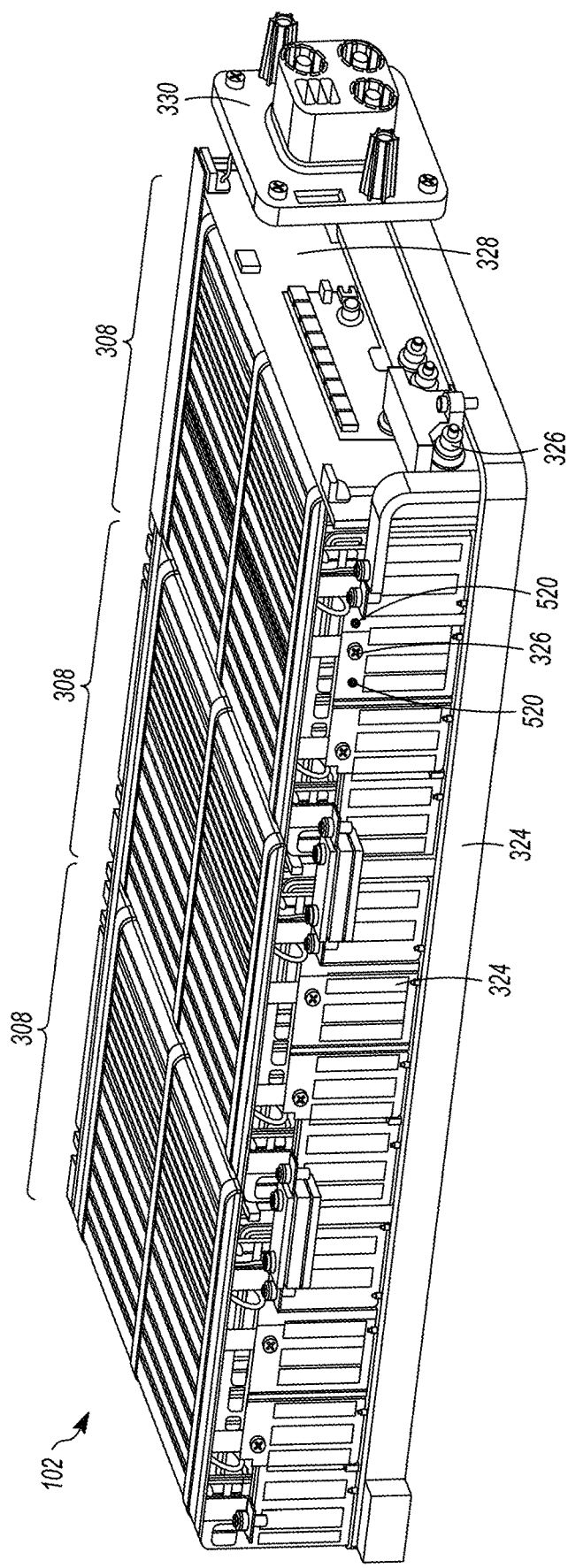
FIG. 3 illustrates the energy storage module shown in FIG. 2 with an exterior housing removed.

FIG. 3 illustrates the energy storage module shown in FIG. 2 with the exterior housing 204 removed. The module includes several energy storage stacks 308. The energy storage stacks may be coupled with one or more conductive bus bars 324 in the module by one or more couplings 326, such as bolts, welds, or the like. The module also includes a monitoring circuit board 328 that may include one or more of the sensors that monitor characteristics of the cells, stacks, groups, and/or module. The module may be coupled with the monitoring circuit board by one or more couplings. A module connector 330 represents an electrical connector that conductively couples the bus bar and the energy storage stacks with another bus bar or conductive pathway in the module.

Figure 4:
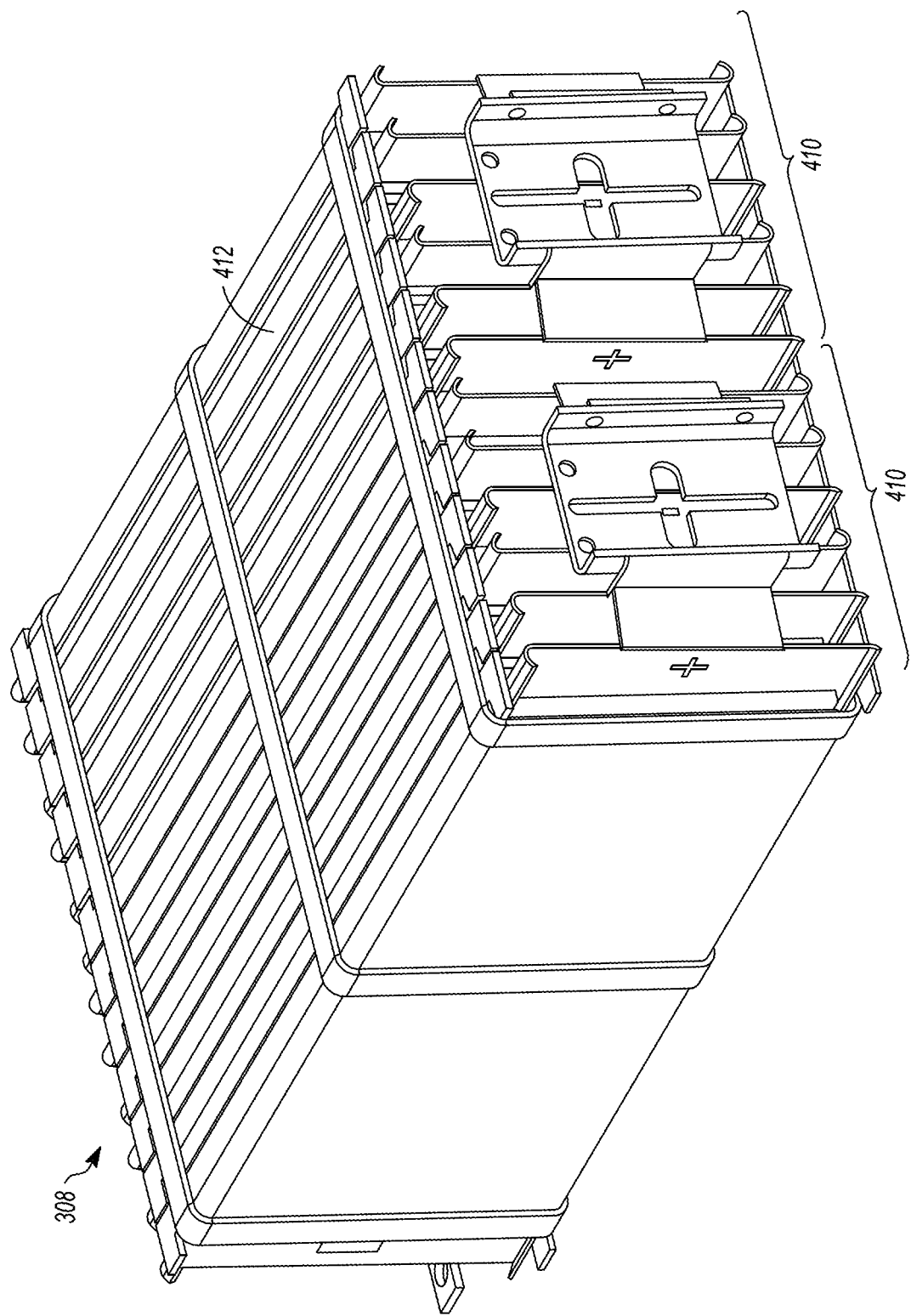
FIG. 4 illustrates an energy storage stacks shown in FIG. 3.

FIG. 4 illustrates one of the energy storage stacks shown in FIG. 3. The stack may be formed from cell groups 410 that includes several energy storage cells 412. The cell optionally may be referred to as a battery cell, and may store electric energy. In one embodiment, each of the cell groups includes two or more of the cells connected in parallel with each other, each of the stacks includes two or more of the cell groups connected in series with each other, each of the modules includes two or more of the stacks connected in series with each other. The energy storage apparatus may have a string of the modules connected in series with each other. Alternatively, several of the cells may be connected in series with each other in a cell group, with the stacks connected in parallel to each other.

As shown in FIG. 1, the energy storage apparatus may include the thermal management circuit 114 that includes one or more conduits that direct a coolant through, between, around, etc., the modules to cool the modules. For example, the thermal management circuit may be formed from fluidly coupled volumes or spaces within the energy storage apparatus between the modules. Air or another coolant may flow through the thermal management circuit to carry heat away from the modules and cool the modules. Optionally, air or another coolant may flow through the thermal management circuit to deliver heat to the modules. The thermal management circuit optionally may include one or more fans or blowers that operate to direct air through the circuit. As another example, the thermal management system may include conduits through which a liquid cooling medium flows to cool or heat components of the energy storage apparatus.

Figure 5:
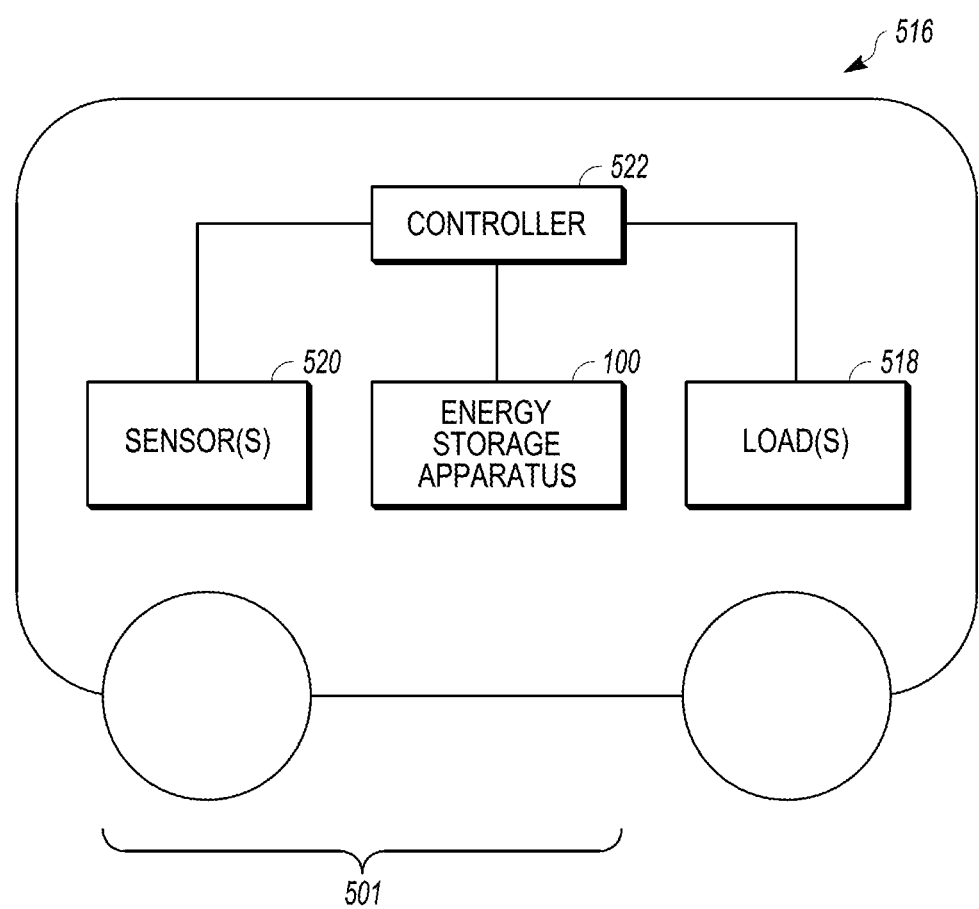
FIG. 5 illustrates one example of a monitoring system onboard a powered system that is at least partially powered by the energy storage apparatus shown in FIG. 1.

FIG. 5 illustrates one example of a monitoring system 501 disposed onboard a powered system 516 that is at least partially powered by the energy storage apparatus shown in FIG. 1. The powered system is a mobile vehicle in the illustrated embodiment. For example, the powered system may be a rail vehicle, automobile, mining vehicle, agricultural vehicle, bus, truck, or the like. Alternatively, the powered system may be stationary. The powered system includes one or more loads 518 that are powered by the energy storage apparatus. These loads may include propulsion loads that operate to propel the powered system (e.g., motors), auxiliary loads that operate to perform work other than propelling the powered system (e.g., the fans or blowers of the thermal management circuit), or the like. The monitoring system includes one or more sensors 520 that monitor characteristics of the energy storage apparatus as described herein. As shown in FIG. 3, the sensors may be disposed on or coupled with one or more of the bus bars. The monitoring system may include or be connected with a controller 522 that controls operation of the powered system. The controller may represent hardware circuitry that includes and/or is connected with one or more processors (e.g., one or more microprocessors, integrated circuits, field programmable gate arrays, or the like). The controller may receive output from the sensors (e.g., via wired and/or wireless connections) to determine a state or health of the energy storage apparatus. The controller may change operation of the energy storage apparatus, the loads, and/or the powered system based on the state or health of the energy storage apparatus that is determined. While the powered system is shown as a land-based vehicle, the powered system may include a stationary system or another type of vehicle that may not include wheels, such as a marine vessel.

In operation, the sensors may measure one or more characteristics of the energy storage apparatus (including one or more of the modules, groups, stacks, cells, couplings, etc.) and communicate the characteristic(s) to the controller. These characteristics may include thermal characteristic(s) and/or electrical characteristic(s). The thermal characteristic(s) may include a temperature of a cell (e.g., a cell temperature), a temperature of a coupling (e.g., a joint temperature); an ambient temperature of the air or environment around or inside the energy storage apparatus; a temperature of a heating or cooling medium; etc. The electrical characteristic(s) may include a current, voltage, power, and/or electric energy conducted through one or more cells, groups, stacks, modules, bus bars, and/or couplings of the energy storage apparatus; an electrical resistance of one or more cells, groups, stacks, modules, bus bars, and/or couplings of the energy storage apparatus; or the like.

The controller optionally may determine one or more estimated (or calculated) parameters from or based on the characteristic(s) provided by the sensor(s). These parameters may include one or more of the cell temperature, resistance, power, and/or energy described above. Optionally, the estimated (or calculated) parameter may include one or more of the other sensor measurements described above. For example, instead of directly measuring a characteristic described above, the characteristic may be estimated or calculated (e.g., as a parameter) based on one or more other measured characteristics.

The controller may detect an unexpected heating event and/or an unexpected cooling event based on the characteristic(s) and/or the estimated parameter(s). These events may be referred to as an unexpected thermal event. The controller may determine the location or component that is unexpectedly hot or cool based on the characteristic(s) and/or parameter(s). For example, the controller may determine that one or more of a welded joint, a bolted joint, a connector, a cell-to-cell connection, a module-to-module connection, a connection between parts of different strings or between different strings, a connection between axles of a vehicle, a connection between vehicles (when the vehicles are coupled), or the like, is unexpectedly hot or cool from the characteristic(s) and/or parameter(s).

The controller may identify, predict, or otherwise determine a failure of a component of the energy storage apparatus based on the thermal event that is detected. For example, the controller may determine that a joint (e.g., coupling) has failed or is likely to fail (e.g., is loose), that the thermal management circuit has failed (e.g., is no longer directing coolant across, through, or over one or more components), that a cell has failed, or the like. Responsive to identifying, predicting, or determining the failure, the controller may implement one or more responsive actions. For example, the controller may deactivate or turn off a module, string, stack, group, or cell; may deactivate or turn off a load; may notify an operator of a need for repair, inspection, or replacement of a module, string, stack, group, cell, or coupling; may slow or stop movement of the vehicle; or the like.

Figure 6:
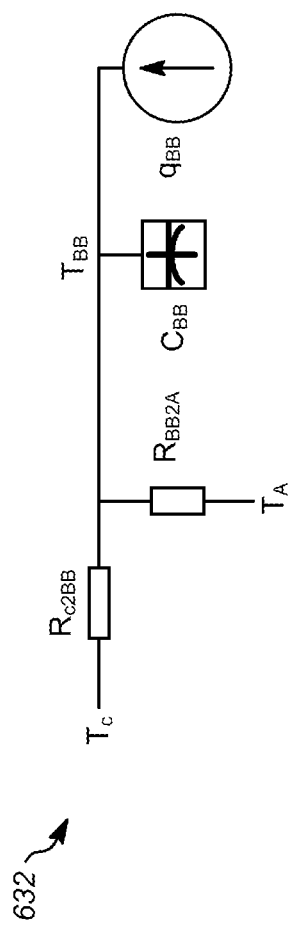
FIG. 6 illustrates one example of a thermal model for a component.

In one example of the controller identifying, predicting, or otherwise determining a component failure, a cell temperature of one or more cells may be measured directly (e.g., by a temperature sensor disposed on or near the cell(s)) or indirectly determined. The cell temperature may be indirectly determined based on other measured characteristics or estimated parameters (e.g., such as current, resistance, ambient temperature, or the temperature of one or more other components). The cell temperature of a battery cell may be indirectly determined using a thermal model for the cell. FIG. 6 illustrates one example of a thermal model 632 for a component. In one embodiment, the circuit represents the thermal transfer function between a measured temperature (e.g., of a bus bar) to a temperature of a battery cell. This model or function may be used to estimate the cell temperature from the measured temperature of the bus bar or other component. Alternatively, the function or model represents the thermal transfer model for multiple battery cells, multiple couplings with the same bus bar, couplings between the bus bar and the heat sink, the thermal management circuit, or the like.

The thermal model shown in FIG. 6 includes thermal losses of a bus bar ($q_{BB}$), a thermal capacitance of the bus bar ($C_{BB}$), a thermal resistance between the bus bar and the ambient environment ($R_{BB2A}$), a thermal resistance ($R_{C2BB}$) between the bus bar and the cell (or the group that includes the cell, the stack that includes the cell, etc.), a temperature ($T_C$) of the cell (or another component, such as multiple battery cells, multiple couplings with the same bus bar, couplings between the bus bar and the heat sink, the thermal management circuit, etc.), a temperature ($T_{BB}$) of the bus bar, and an ambient temperature ($T_A$). The thermal losses, thermal capacitance, thermal resistances, etc., may represent physical characteristics of the energy storage apparatus and may be determined through testing and analysis. For example, these values may represent physical characteristics of the components based on design and test, including material properties, dimensions, etc. Optionally, the thermal models described herein may consider, include, or be based on one or more additional characteristics. For example, the thermal model may include an ambient thermal resistance between a bus bar and an ambient atmosphere ($R_{bb2a}$), a component thermal resistance between the bus bar and the energy storage apparatus, a thermal resistance between the battery cell and a liquid cooling medium of the thermal management system, a thermal resistance between a battery cell and at least one other battery cell, a temperature differential between internal components within a common housing that are powered by the energy storage apparatus, a temperature differential between shared components that are powered by common current from the energy storage apparatus, a thermal resistance between one or more of the cells and a liquid coolant of the thermal management system (e.g., between the cells and the heat sink versus the ambient environment, thermal losses between the cells, etc. The thermal model may account for or be based on thermal gradients between components, such as components in the energy storage apparatus that share current, share a thermal circuit, etc. These thermal gradients may be known or expected gradients within a housing of the energy storage apparatus, between housings of nearby energy storage apparatuses, etc.

The cell temperature, bus bar temperature and the ambient temperature may be measured by one or more sensors. The controller may also use the thermal model to derive or otherwise determine the cell temperature such that the cell temperature need not be directly measured by a sensor. Given the magnitude and sensitivity of the cell temperature compared to busbar temperature, it may be difficult to detect or otherwise measure the temperature of joints that may fail if the sensor is not located close to the joints. Also, given cost pressures and reliability targets, it may be beneficial to reduce the number of sensors in the system. Due to both of these factors, given the choice between the cell and the busbar, one location of the sensor placement is on the busbar and joints to have detection of both these joints and the cell temperatures.

Figure 7:
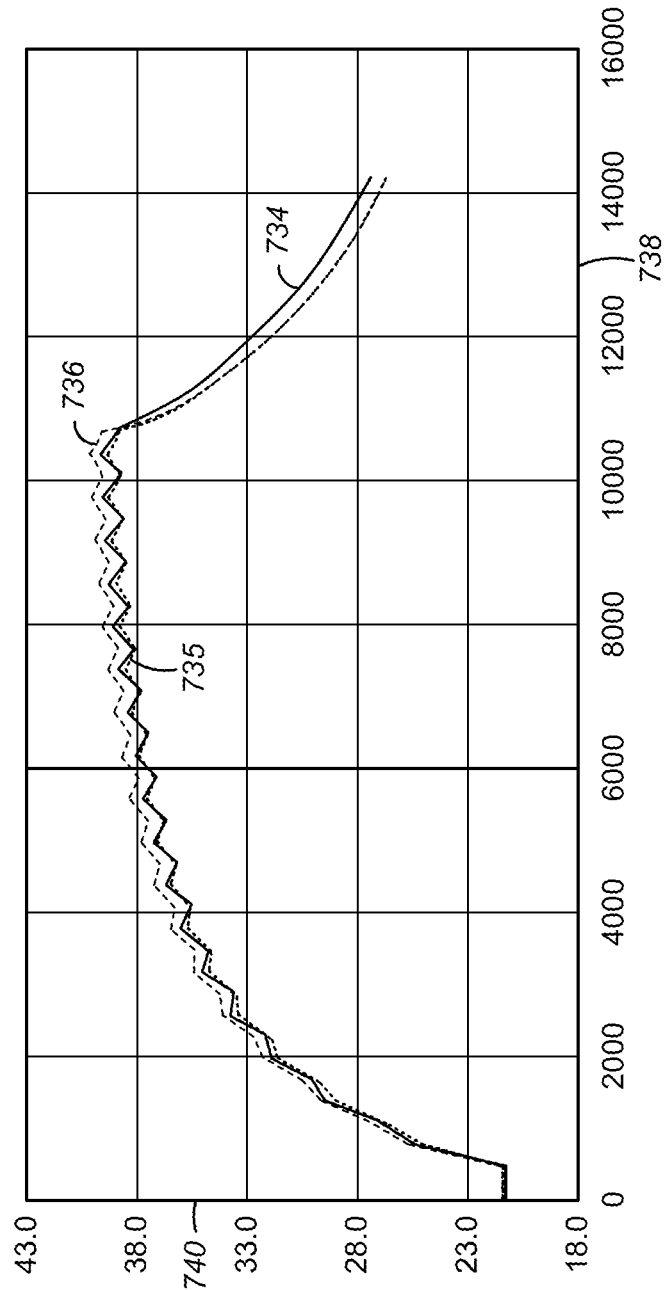
FIG. 7 illustrates one example of an estimated parameter and a measured characteristic.

FIG. 7 illustrates one example of an estimated parameter 735 and measured characteristics 734, 736. The parameter and characteristics are shown alongside a horizontal axis 738 representative of time or sensor samples and alongside a vertical axis 740 representative of temperature. The measured characteristic 734 may be the measured temperature of a bus bar and the measured characteristic 736 may be the temperature of a battery cell. The estimated parameter 735 may be the estimated or derived temperature of a battery cell. The estimated parameter may be determined using the thermal model shown in FIG. 6 and described above.

As shown in FIG. 7, the estimated cell temperature closely follows the measured cell temperature. For example, the estimated cell temperature is within a designated threshold (e.g., within 5%, within 3%, or within 1% in different embodiments) of the measured cell temperature across the horizontal axis, the estimated cell temperature includes changes that correspond with changes in the bus bar temperature (e.g., the positive and negative increases in the cell temperature and bus bar temperature occur at the same time or at least during overlapping time periods, etc.), or the like. From these corresponding absolute values, rates of change and/or comparison to other measured or estimated cell temperatures, the controller may determine that the cell temperature is within a desired or predetermined operating (not excluding idle) area. In another example of the controller identifying, predicting, or otherwise determining a component failure, unexpected heating or cooling of one or more other components in the energy storage assembly may be determined and used to identify, predict, or otherwise determine failure of the component(s). A component may unexpectedly heat when a temperature of the component increases by a greater amount than one or more other components, increases at a greater rate than one or more other components, and/or does not decrease while the temperature of one or more other components decreases. Conversely, a component may unexpectedly cool when a temperature of the component decreases by a greater amount than one or more other components, decreases at a greater rate than one or more other components, and/or does not increase while the temperature of one or more other components increases.

The other component(s) may be the same type of component, such as when the temperature of a battery cell is compared with another battery cell, when the temperature of one coupling is compared with another coupling, when the temperature of one bus bar is compared with another bus bar, and so on. Optionally, the other component may be a different type of component, such as when the temperature of a battery cell is compared with a coupling or bus bar, when the temperature of a coupling is compared with a bus bar or cell, when the temperature of a bus bar is compared with a cell or coupling, and so on.

The unexpected heating or cooling of a component may be directly determined by measuring the temperature of the component and at least one other component using one or more of the sensors to directly measure the component temperatures (with the controller comparing the temperatures and/or changes in temperature). Optionally, the unexpected heating or cooling may be indirectly determined by estimating temperatures and/or temperature changes of one or more of the components (the component being examined and/or the component to which the examined component is compared). The temperatures may be measured using characteristics such as power, voltage, and/or resistance of the component(s). Optionally, the temperatures may be estimated using parameters such as current, resistance, ambient temperature, and/or temperatures of nearby (e.g., adjacent or within a designated distance, such as ten centimeters) components.

Figure 8:
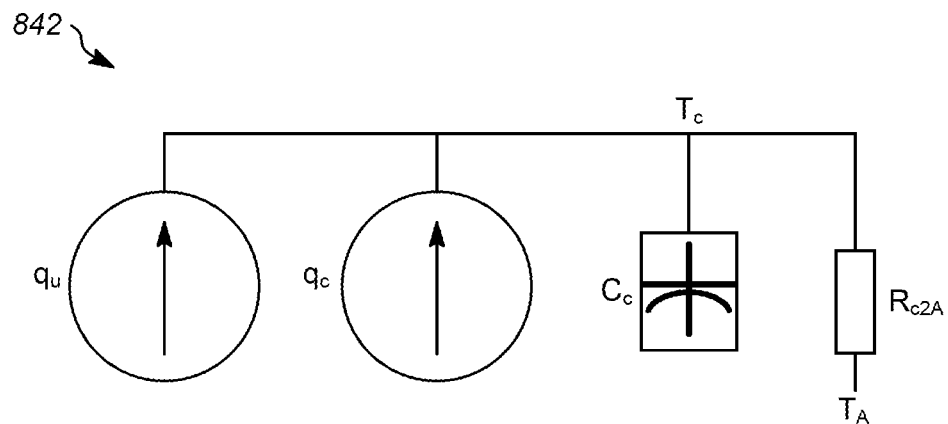
FIG. 8 illustrates another example of a thermal model for a component.

The controller may receive measurements from sensors and use one or more transfer functions to determine the heating or cooling of a component, and then determine whether the heating or cooling is unexpected. The controller may determine that the source or cause of the unexpected heating or cooling is a faulty cell, stack, group, or module; a faulty coupling; a failure of the thermal management circuit (e.g., one or more of the blowers or fans); failed sensor; or the like. FIG. 8 illustrates one example of a thermal model 842 for a component. In one embodiment, the circuit represents the transfer function between one or more electrical characteristics (e.g., watts in the energy storage apparatus), thermal characteristics (e.g., thermal resistance of the cell to ambient, thermal capacitance of a battery cell) and a temperature of a battery cell. The function or model may be used to ensure all the temperature rise/decrease in the system explain the behavior of the measured or estimated cell temperature from the electrical characteristic. Alternatively, the model or function may be used for multiple battery cells, multiple couplings with the same bus bar, couplings between the bus bar and the heat sink, the thermal management circuit, or the like.

The thermal model shown in FIG. 8 includes a temperature of a component ($T_C$, such as the measured or estimated temperature of a cell, cell group, cell stack, etc.), the thermal losses of the component ($q_C$), a thermal capacitance of the component ($C_C$), a thermal resistance from the component to ambient ($R_{2CA}$), and an unexpected thermal loss of the energy storage apparatus ($q_U$). The temperature, thermal losses, thermal capacitance, thermal resistance, etc., represent physical characteristics of the components based on design and testing, including material properties, dimensions, etc. The unexpected temperature rise or decrease may be determined from the model or transfer function. For example, the controller may use the thermal model to derive or otherwise determine the unexpected heating or cooling of the assembly.

Optionally, the controller may obtain a measured and/or estimated temperature of a coolant flowing through the thermal management system. The controller may examine this temperature and/or changes in the temperature of the coolant to determine whether there is a fault in the thermal management system and/or one or more components of the energy storage apparatus. For example, if the coolant temperature exceeds a threshold or is not decreasing, this may indicate that the thermal management system has failed and/or that a component within the energy management system is unexpectedly heating. As another example, if the coolant temperature falls below another threshold or is not increasing while the energy storage apparatus is operating, this may indicate that the energy storage apparatus is unexpectedly cooling. The controller then may determine a fault in the thermal management system and/or the energy storage apparatus. Optionally, if the coolant temperature is not able to be directly measured, then the temperatures of several components of the energy storage apparatus may be measured or estimated to determine whether several components are unexpectedly heating or cooling, which may indicate a fault in the thermal management system and/or the energy storage apparatus, as described below.

Figure 9:
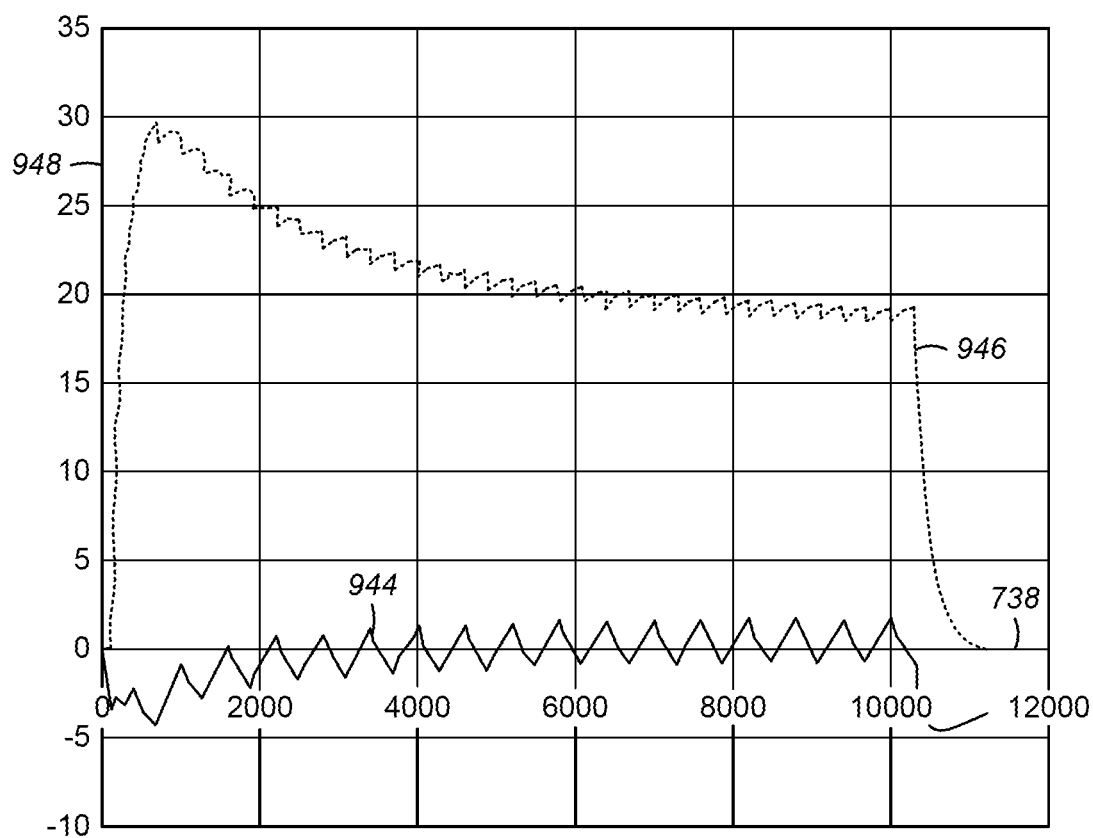
FIG. 9 illustrates one example of an estimated parameter and a measured characteristic.

FIG. 9 illustrates one example of an estimated parameter 944 and an estimated or measured characteristic 946. The parameter and characteristic are shown alongside the horizontal axis 738 representative of time or sensor samples and alongside a vertical axis 948 representative of watts (e.g., heating watts). In one example, the measured (or estimated) characteristic may be the measured losses (e.g., in watts) of a battery cell and the estimated parameter may be the estimated net losses (e.g., in watts) of the energy storage system. The estimated parameter may be determined using the thermal model shown in FIG. 8 and described above.

The estimated parameter 944 ideally should result in a value of zero due to Kirchoff's law. The watts in the system (e.g., the measured characteristic 946 and the like) combine to make up the total watts in the system, which is represented by the estimated parameter 944. As shown in FIG. 9, the transient responses of the measured characteristic 946 at time 0 to 1000 and from time 10,500 to 11,000 result in non-zero values of the estimated parameter 944 (i.e., the watts produced from the transient response are unaccounted for). The steady state response of the measured characteristic 946 (and the like in the system) result in a net zero value of the estimated parameter 944. Non-zero values of the estimated parameter 944 may indicate that there is a fault in the apparatus, such as a faulty cell, a faulty coupling, a failed thermal management circuit, failed sensor, or the like. From these values and/or changes, the controller may determine that the cell temperature is increasing or decreasing as expected. This may indicate that there is no fault with the cell without directly measuring the cell temperature. Therefore, the controller may determine that the state or health of the cell is good, positive, or without need for inspection, repair, or replacement based on this comparison.

Significant deviations between the estimated parameter and the measured characteristic, however, may indicate a fault or predicted fault in the cell. For example, if the estimated cell temperature is changing too quickly, the estimated cell temperature does not change with current in the system, or the like, then the controller may determine that the cell temperature is not behaving as expected. This may indicate that there is a fault or predicted fault with the cell without directly measuring the cell temperature. Therefore, the controller may determine that the state or health of the cell is poor, negative, or needs inspection, repair, or replacement based on this comparison.

Optionally, the controller may change operation of the load(s) and/or energy storage apparatus, measure one or more characteristics and/or estimate one or more parameters of components, and use this information to detect or predict a fault. For example, the controller may direct a load to demand current from the energy storage apparatus (e.g., by changing a setting, such as a throttle setting, a temperature of a heating or cooling system, or the like) to change how much current is demanded. The controller may then monitor measured characteristics and/or estimate parameters of one or more components of the energy storage apparatus to determine whether the characteristic(s) and/or parameter(s) change in response to the change in demanded current.

Figure 10:
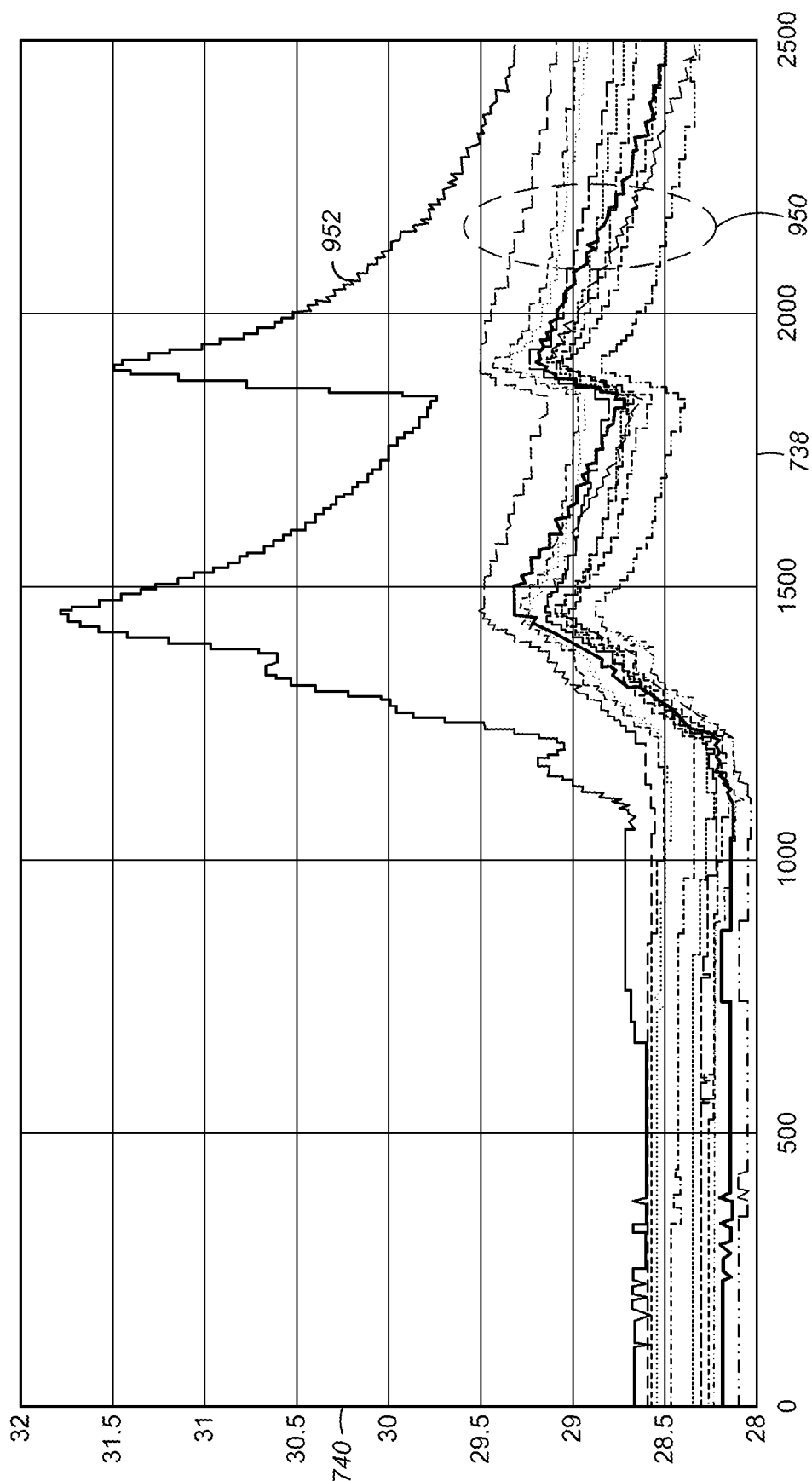
FIG. 10 illustrates examples of measured characteristics of an energy storage apparatus.
Figure 11:
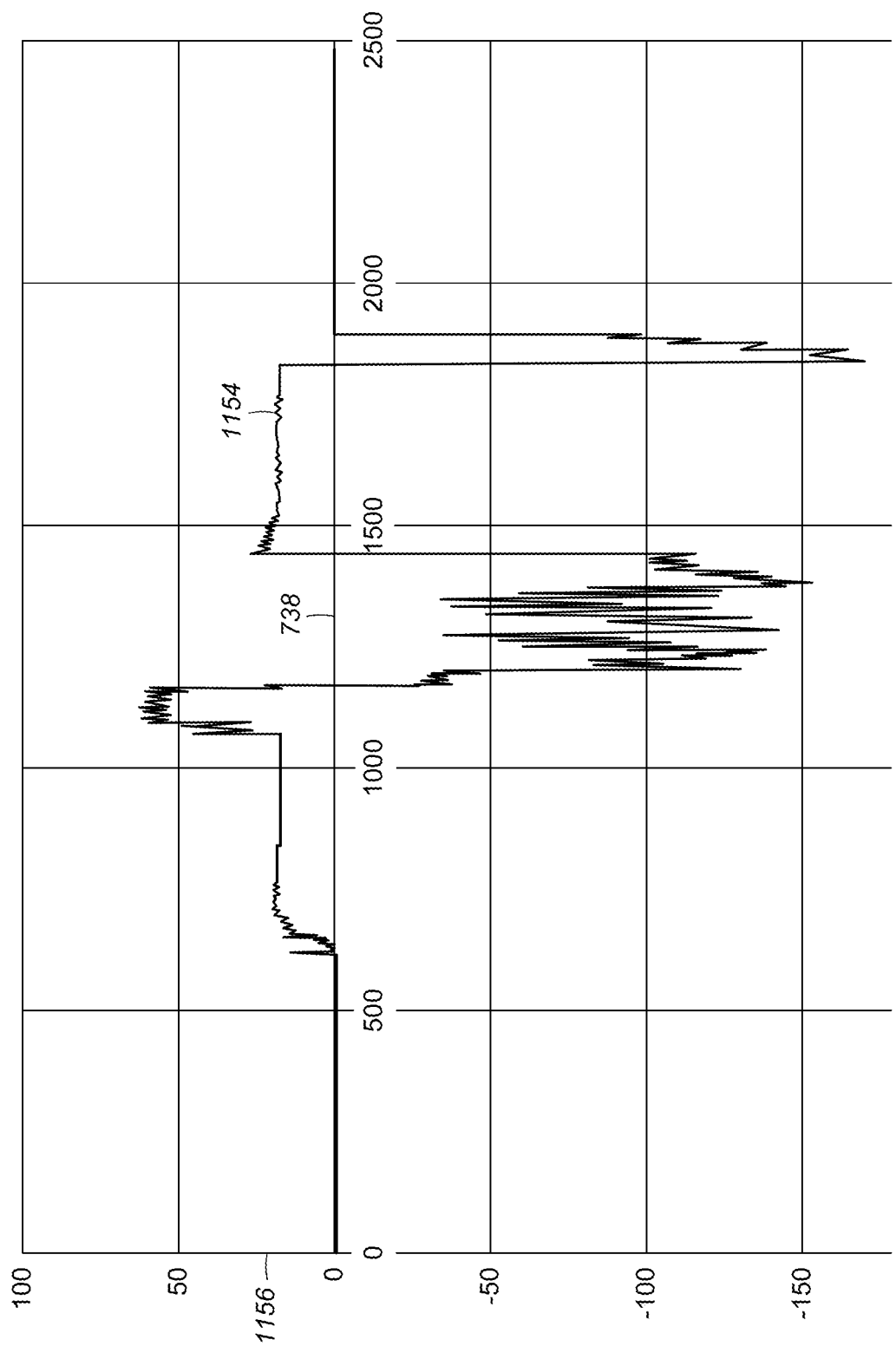
FIG. 11 illustrates another example of a measured characteristic of the energy storage apparatus.

FIGS. 10 and 11 illustrate examples of measured characteristics of the energy storage apparatus. Several different cell temperatures 950, 952 are shown in FIG. 10 alongside the horizontal axis 738 indicative of time or samples, and alongside the vertical axis 740 representative of temperatures. Optionally, the temperatures 950, 952 may be busbar temperatures, component temperatures, or the like. A current 1154 is shown in FIG. 11 alongside the horizontal axis 738 and a vertical axis 1156 representative of amps. This current may represent the current demanded by one or more loads being controlled by the controller. The cell temperatures shown in FIG. 10 may be directly measured (e.g., as characteristics) or estimated (e.g., as parameters), as described herein. The behavior of the cell temperatures 950, 952 in FIG. 10 may also be observed against the current 1154 in FIG. 11 without the controller changing a setting (e.g., operating at idle) and failures could be observed.

The controller may change a setting of the powered system. As shown in FIG. 11, the controller may control a load to increase the current demanded by the load by a first amount (e.g., by turning on the load) at or near time 600 along the horizontal axis, and then increase the current demanded by a greater, second amount (e.g., by changing a setting of the same load or by activating one or more additional loads) at or near time 1100 along the horizontal axis.

The controller may then compare how the different cell temperatures change in response to the current change. As shown in FIG. 10, the cell temperatures 950 (representative of the temperatures of several different cells) all closely correspond to each other in terms of both temperatures, changes in temperature, and rates of change in temperature. But, the cell temperature, component temperature, or the like 952 does not closely match or correspond to the cell temperatures, component temperature, or the like 950. The cell temperature 952 increases by a greater amount and increases at greater rates than the cell temperatures 950. The controller may determine from these differences that the cell represented by the cell temperature 952 is unexpectedly heating. The controller may determine that the cell (or a related component, such as a bus bar coupled with the cell, a coupling between the cell and the bus bar, etc.) is in need of repair, inspection, or replacement, while the cells associated with the temperatures 950 are not in need of repair, inspection, or replacement.

The detection or identification of unexpected heating or cooling of a component of the energy storage apparatus may be used by the controller to determine that a failure in the thermal management circuit has occurred. For example, responsive to detecting unexpected heating or cooling of a component, the controller may determine that the thermal management circuit has failed (e.g., one or more blowers or fans have failed). The controller may issue an alert or warning to an operator (e.g., via an output device of the powered system, such as a speaker, display, light, etc.) to notify the operator of the failure. Optionally, the controller may reduce operation of the powered system, such as by slowing or stopping movement of the powered system, deactivating one or more loads, or the like. In one example, the controller may determine whether the unexpected heating or cooling of a component in one module also is detected in one or more other modules of the same energy storage apparatus. In one embodiment, the controller determines whether the unexpected heating of a component in one module also occurs in another module that is connected with the same thermal management circuit (where the energy storage apparatus includes multiple thermal management circuits) and/or electrical circuit (e.g., where the components are in a series such that the components may receive the same current). If multiple modules coupled with the same thermal management circuit in the same energy storage apparatus exhibit the unexpected heating, then the controller may determine a failure or fault within the thermal management circuit (e.g., a failed fan or blower). As another example, if a module does not include a component having unexpected heating or cooling when compared with other components in the same module, but the module (or components of the module) exhibits (or exhibit) unexpected heating when compared with the other modules, then the controller may determine a fault in the thermal management circuit or module, such as a clogged conduit of the circuit, a loss of thermal coupling between the module and a heat sink, etc.).

Figure 12:
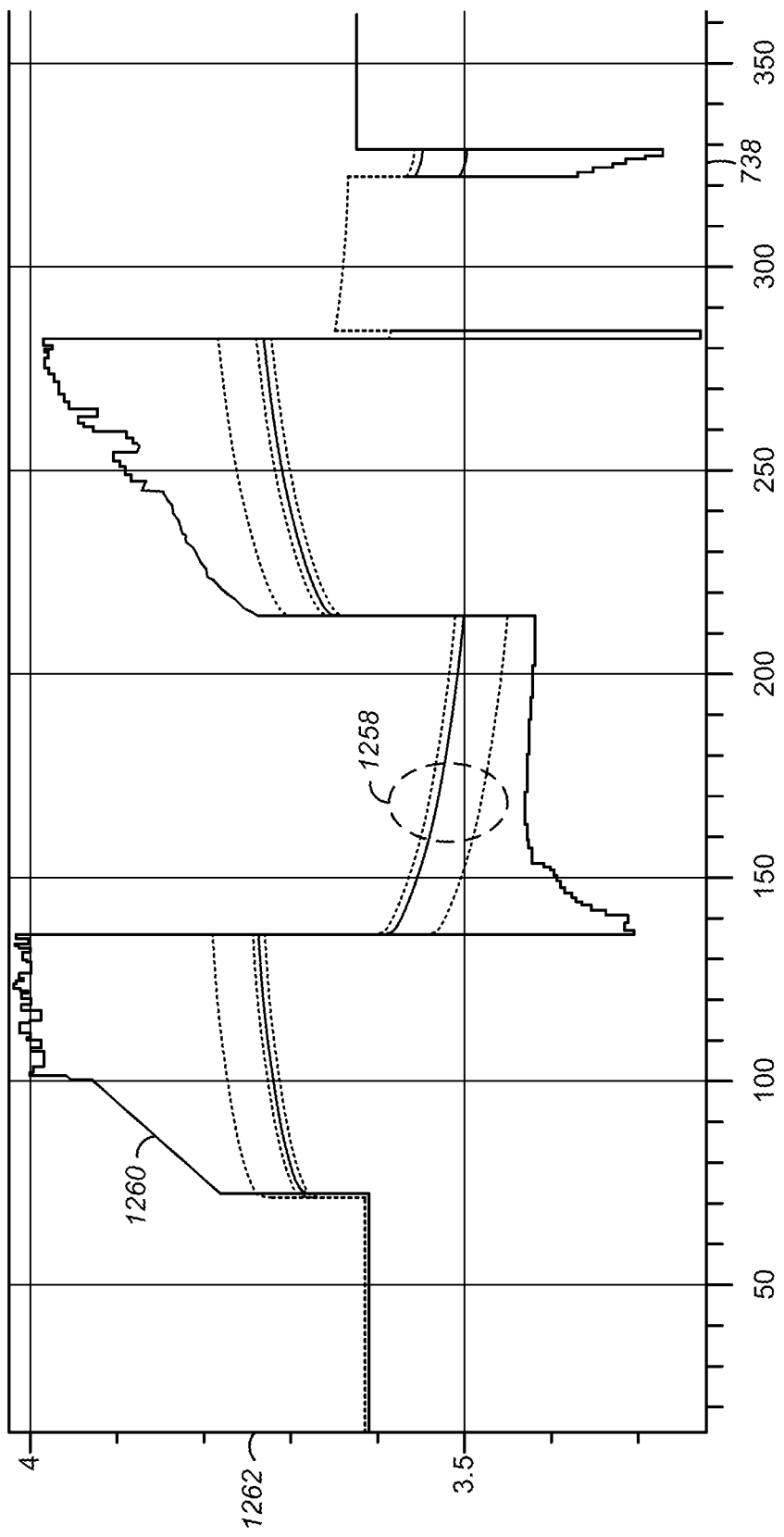
FIG. 12 illustrates another example of measured characteristics of the energy storage apparatus.
Figure 13:
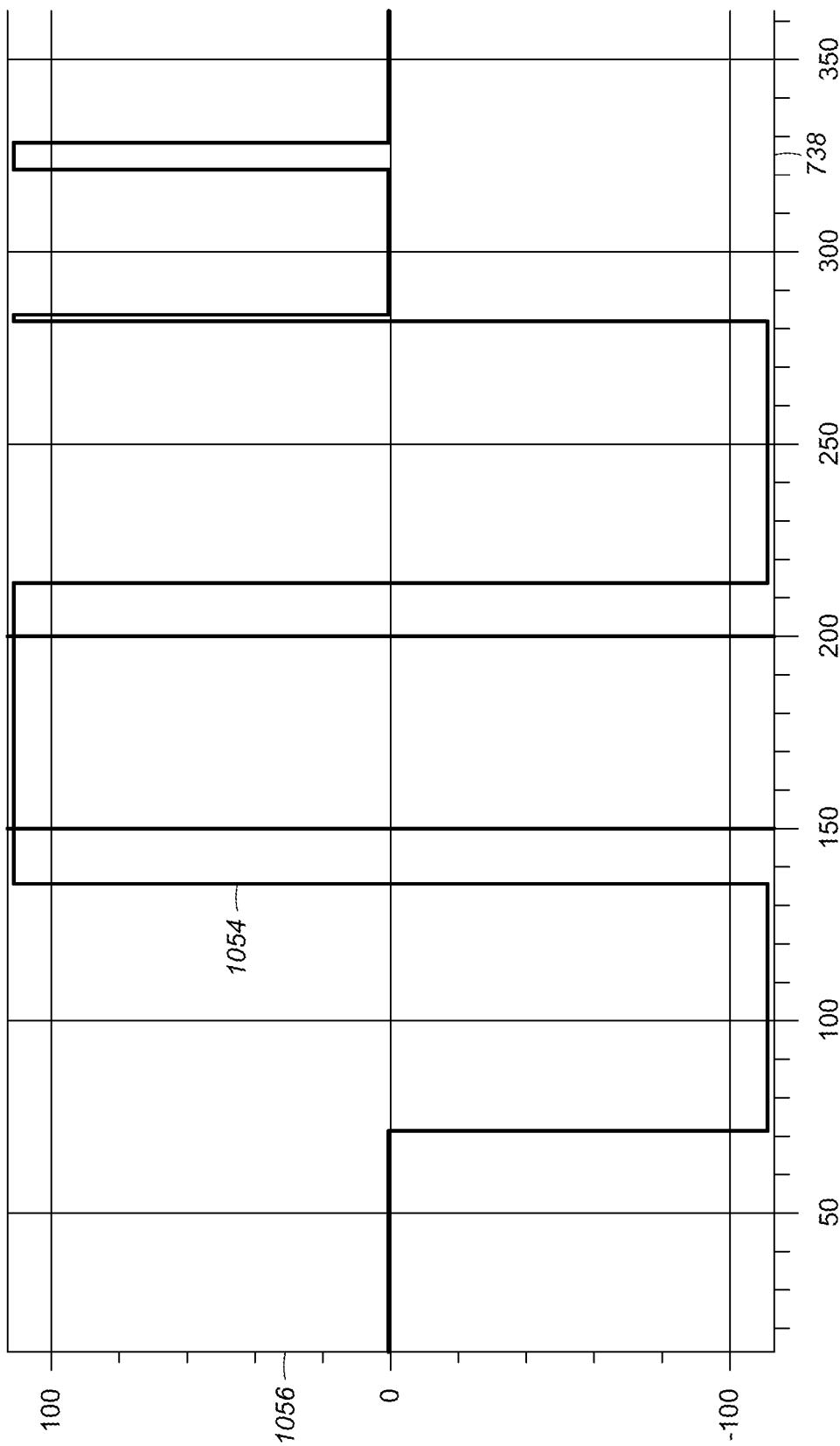
FIG. 13 illustrates another example of measured characteristics of the energy storage apparatus.

The controller also may monitor changes in the voltage or potential of the different cells in response to changes in demanded current. This may be performed in addition to the analysis described above (e.g., to confirm a faulty cell) or as an alternative to the analysis described above. FIGS. 12 and 13 illustrate another example of measured characteristics of the energy storage apparatus. Several different cell potentials 1258, 1260 are shown in FIG. 12 alongside the horizontal axis 738 indicative of time or samples, and alongside a vertical axis 1262 representative of cell voltages (e.g., potentials). The current 1054 shown in FIG. 13 is alongside the horizontal axis 738 and the vertical axis 1056 described above. This current may represent the current demanded by one or more loads being controlled by the controller. The cell potentials shown in FIG. 12 may be directly measured (e.g., as characteristics) or estimated (e.g., as parameters), as described herein.

The controller may change a setting of the powered system. As shown in FIG. 13, the controller may control a load to change the current demanded by the load at different times. The controller may then compare how the different cell potentials change in response to the change in demanded current. As shown in FIG. 12, the cell potentials 1258 (representative of the potentials of several different cells) all closely correspond to each other in terms of both temperatures, changes in temperature, and rates of change in temperature. But, the cell potential 1260 does not closely match or correspond to the cell potentials 1258. The cell potential 1260 increases and decreases by greater amounts and increases and decreases at greater rates than the cell potentials 1258. The controller may determine from these differences that the cell associated with the cell potential 1260 indicates a fault with the cell or related component (e.g., bus bar, coupling, etc.), while the cells associated with the potentials 1258 are not in need of repair, inspection, or replacement.

The monitoring system optionally may detect thermal runaways of one or more components within the energy storage apparatus. A thermal runaway may occur when a temperature increase of a component further increases temperatures within the energy storage apparatus, which may lead to destruction or damage to the energy storage apparatus if left unchecked. The controller may identify a thermal runaway or suspected thermal runaway based on a sensor measured temperature of a cell group or an estimated cell group temperature, based on estimated thermal or electrical losses in a cell or cell group, based on a rate of change of a temperature of a cell group, and/or based on a string of connected resistances in the energy storage apparatus that increases with increasing temperature.

With respect to detecting thermal runaway using cell group temperatures, the controller may estimate or calculate (e.g., as a parameter) one or more cell group temperatures in the energy storage apparatus and compare each cell group temperature to multiple thresholds. For example, the controller may compare cell group temperatures to two absolute thresholds. An absolute threshold may be a threshold having a value that does not change during operation and is not determined as a difference from a measured value. The absolute threshold may be a hard-coded value that does not change or may be a configurable value that is changeable (e.g., by an operator). The controller may compare a cell group temperature of a first cell group in a module of the energy storage apparatus to a first absolute temperature threshold and may compare a cell group temperature of at least a different, second cell group in the same module in the same energy storage apparatus to a different, second absolute threshold. If the temperatures of both the first and second cell groups in the same module each exceeds the corresponding threshold, then the controller may determine that the module is suspected of thermal runaway (or is experiencing thermal runaway). If one or more other modules do not include cell groups having temperatures that similarly exceed the thresholds, then the controller may confirm that the module having the cell groups with the temperatures that exceed the respective thresholds is experiencing thermal runaway. In response, the controller may deactivate the module experiencing thermal runaway (or suspected of thermal runaway) or may deactivate the energy storage apparatus (e.g., by turning off the module or apparatus).

As another example, the controller may use an unexpected rise or increase in an estimated cell group temperature to detect thermal runaway in a cell group of a module. The controller may determine whether an increase in the (measured or) estimated temperature of a first cell group in a first module of the energy storage apparatus is greater than a first threshold temperature increase and the temperature rise differential within the first module exceeds a second threshold temperature increase. This increase may be a difference between a lower or minimum temperature and an upper or maximum temperature of the first cell group that is estimated during a designated time period (e.g., the time period that the controller is examining the module). The controller then may determine whether a difference between a temperature rise of a first cell group and a temperature rise of other cell groups in other modules, but the same module position within each respective module exceeds a different, third threshold temperature increase. For example, the controller may separately compare the magnitude of the temperature rise in the first cell group of the first module with the magnitude of the temperature rise (if any).

Figure 14:
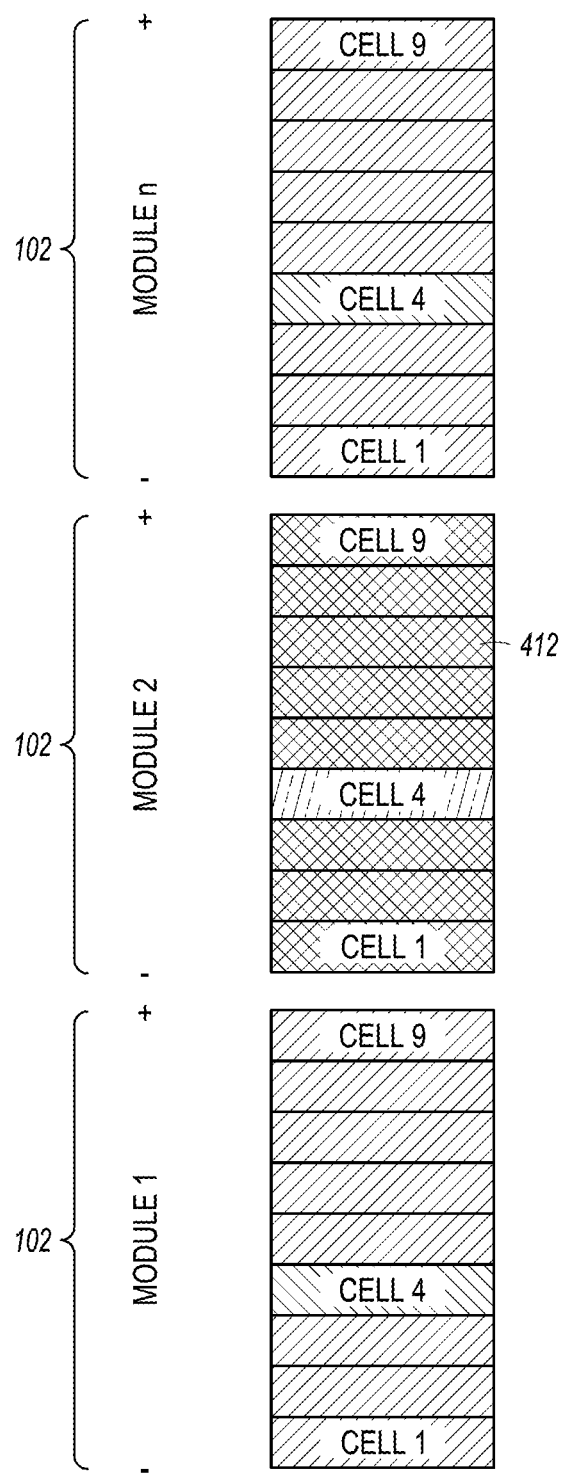
FIG. 14 schematically illustrates examples of different cells in different modules of the energy storage apparatus.

If the temperature rise in the first cell is greater than the temperature rises in the other cells of the same module (all other cells in the same module or at least a designated number of the other cells in the same module), then the controller may compare the temperature rise of the first cell with the temperature rise(s), if any, of the cells in the same module position or location as the first cell in one or more (or all other) modules. FIG. 14 schematically illustrates examples of different cells or cell groups 412 in different modules 102 of the energy storage apparatus. In the illustrated example, there are n modules shown with each module including nine cells. The controller may compare the temperature rise of each cell in the energy storage apparatus to a first threshold. The controller may also compare the temperature rise differential of all cells within each module. The controller may then compare temperature rise in cell position across modules. For instance, the controller may compare the temperature rise in the fourth cell ("Cell 4") in the second module ("Module 2") with the temperature rise in the fourth cell ("Cell 4") in the first module ("Module 1"), with the temperature rise in the fourth cell ("Cell 4") in the nth module ("Module n"), and so on. In the example, if the temperature rise differential in the fourth cells in all modules (or at least a designated number of the modules) exceeds a third threshold temperature increase, the temperature rise of the fourth cell of Module 2 exceeds the first absolute threshold temperature increase, and the temperature rise differential within Module 2 exceeds the second threshold temperature increase, then the controller may determine that a thermal runaway event is occurring.

Otherwise, if the controller determines that the temperature rise of the fourth cell in the second module does not exceed the first absolute threshold temperature increase, determines that the differential between the temperature rise of the fourth cell in the second module and the temperature rise of the first through third and fifth through ninth cells in the second module does not exceed the second threshold temperature increase, or that the temperature rise of the fourth cells in all (or a threshold number) of the modules does not exceed the third threshold temperature increase, then the controller may determine that a thermal runaway is not occurring.

In response to detecting the thermal runaway event, the controller may implement one or more responsive actions. For example, the controller may deactivate or otherwise restrict the string of modules experiencing the thermal runaway event from operation. The controller may turn off or disconnect (e.g., using one or more switches) the string of modules from the load(s). Optionally, the controller may generate a warning signal or alarm to notify an operator of the powered system of the thermal runaway event. The controller may turn on a battery cooling system, turn on the thermal management apparatus, and/or turn on a HVAC (heating, ventilation, and air conditioning system) to cool the string of modules. The controller may disable cell balancing between the different cells in the string of modules to avoid usage of those cells. The controller may enable a fire suppression system of the powered system to extinguish or prevent a fire caused by the thermal runaway event. The controller may enable one or more fans or blowers (e.g., exhaust blowers) that force battery gases associated with or emitted by the cells due to the thermal runaway event out of the energy storage apparatus and/or powered system.

The controller may select which of these responsive actions to implement based on different temperature rise thresholds or sets of thresholds. For example, as described above, the controller may compare temperature rises of the cells against different threshold temperature increases. The controller may use different sets of these thresholds and, depending on which set of thresholds are exceeded (as described above), a different responsive action (described above) may be implemented.

If the thermal runaway event ends and/or the cell temperatures return to normal temperatures (e.g., no longer exceed the threshold(s)), the controller may direct the energy storage apparatus to reduce the state of charge of the cell or cells having the elevated temperatures that caused the thermal runaway event to be detected.

As described above, the energy storage apparatus may include several couplings (e.g., bolts, welds, etc.) that are conductive and provide conductive pathways for conduction of current between the different cell groups, stacks, modules, and/or strings. One or more of these couplings may become damaged (e.g., the bolts become loose or cracked, the welds become cracked, etc.), which may decrease the conductivity (or increase the resistance) of the conductive pathway that extends through the damaged coupling. Current conducted through a damaged coupling may generate heat and increase the risk of thermal damage, which may result or cause one or more cells to go into a thermal runaway event. The controller may receive sensor measurements of temperature or resistance (e.g., by measuring a voltage at a known current) at or near the different couplings. If the temperature and/or resistance increases, the controller may determine that a coupling is damaged or failed. For example, the controller may receive sensor measurements indicative of heat and/or resistance in a location near (e.g., within a threshold distance, such as one to five centimeters) a coupling. The controller may compare the temperature and/or resistance with an absolute threshold. If the temperature or resistance exceeds this threshold, the controller may determine that the coupling that is near the sensor has failed or is in need of inspection, repair, or replacement. As another example, the controller may compare an increase in the temperature and/or resistance with a relative threshold. If the increase in temperature or resistance exceeds this threshold, the controller may determine that the coupling that is near the sensor has failed or is in need of inspection, repair, or replacement. Different sensors may be disposed near different couplings. The controller may determine which coupling has failed or is in need of inspection, repair, or replacement based on how close the sensor is to the different couplings.

In one embodiment, the controller examines the temperature measurements from several sensors disposed throughout the energy storage apparatus. The controller may offset or modify one or more (or all) of the sensed temperatures to account for temperature variations in the energy storage apparatus (e.g., across a string of the modules). For example, the controller may calculate an average or median of the sensed temperatures and compare each sensed temperature with this average or median. If the difference between an elevated sensed temperature and the average or median sensed temperature exceeds a threshold, the controller may determine that one or more couplings near the elevated sensed temperature are damaged or in need of inspection, repair, or replacement.

Optionally, the controller may utilize known, localized heating in different locations within the energy storage apparatus to account for or modify one or more of the sensed temperatures. For example, the monitoring circuit board or other circuit boards within the energy storage apparatus may include devices that generate heat or reduce during normal operation of the devices, such a processor that controls passive cell balancing, fuses, coolant conduits, etc. The controller may examine the temperatures measured by sensors located near these devices or circuit boards, and may modify or bias these temperatures. For example, a sensed temperature obtained by a sensor located near the processor controlling passive cell balancing and/or a fuse may be reduced by the controller by a designated amount or percentage to account for the heat generated by normal operation of these devices. As another example, a sensed temperature obtained by a sensor located near the coolant conduit (e.g., of the thermal management system) may be increased by the controller by a designated amount or percentage. The controller may use these adjusted or biased temperatures when comparing temperatures to determine whether any component of the energy storage apparatus is exhibiting abnormally elevated temperatures, as described above.

Figure 15:
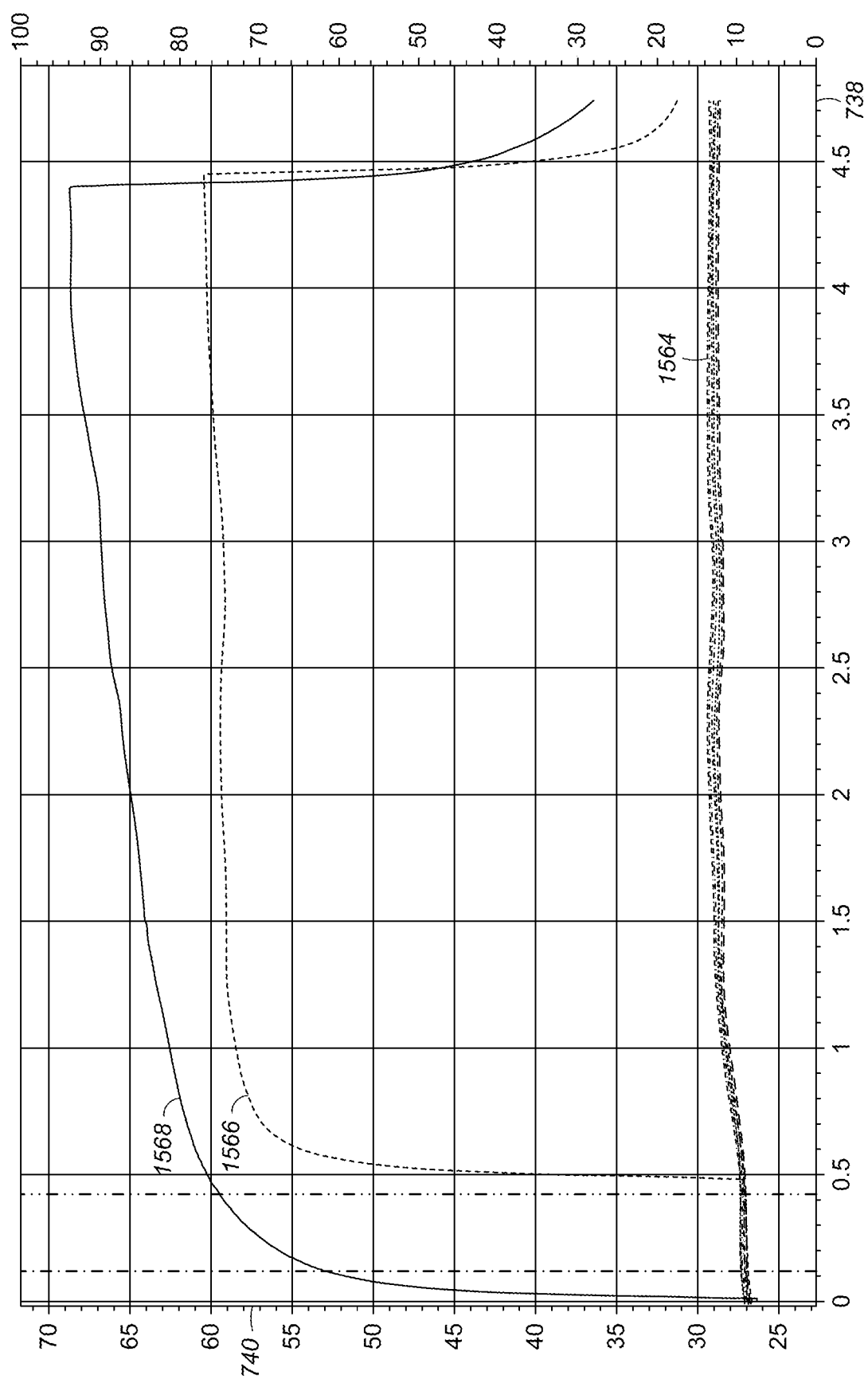
FIG. 15 illustrates one example of temperatures that may be examined by the controller to identify a failure or need for inspection, repair, or replacement of a component of the energy storage apparatus shown in FIG. 1.

FIG. 15 illustrates one example of temperatures 1564, 1566, 1568 that may be examined by the controller to identify a failure or need for inspection, repair, or replacement of a component of the energy storage apparatus shown in FIG. 1. The temperatures are shown alongside the horizontal axis 738 and the vertical axis 740 described above. These temperatures may be measured or estimated temperatures of one or more couplings in the energy storage apparatus, such as a bolt or weld between a bus bar and a module. The temperatures 1564 may represent temperatures of the coupling while the energy storage apparatus is not performing load balancing among the modules and while the coupling has not failed. The coupling may be a bolt connected with at least one of the modules. The load balancing may include the energy management apparatus controlling different modules to supply energy to the load(s) at different times to distribute how long and/or how much potential is supplied by the different modules. The temperatures 1564 may represent the temperatures measured at or near the coupling while the coupling is healthy and not broken or loose (e.g., failed). The temperatures 1566 may represent temperatures of the coupling while the energy storage apparatus is performing load balancing among the modules and while the coupling has not failed. The temperatures 1568 may represent temperatures of the coupling while the energy storage apparatus is performing load balancing among the modules, but the coupling has failed (e.g., is broken or is loose).

These temperatures may indicate to the controller whether the coupling has failed. For example, if the measured or estimated temperatures of the coupling are the same or similar to the temperatures 1564 (e.g., do not include significant increases), then the controller may determine that the coupling has not failed or is not in need of repair, inspection, or replacement. If the controller determines that load balancing is being performed and the measured or estimated temperatures of the coupling are the same or similar to the temperatures 1566 (e.g., do not exceed a threshold that is warmer than an upper or maximum of the temperatures 1566), then the controller may determine that the coupling has not failed or is not in need of repair, inspection, or replacement. But, if the measured or estimated temperatures of the coupling rise to the temperatures 1568 (e.g., above the threshold), the controller may determine that the coupling has failed (e.g., is broken or loose). The controller may then implement one or more responsive actions, as described herein.

The controller optionally may control the energy storage apparatus to perform a pulse test. A pulse test may involve the controller directing one or more of the energy storage apparatus and/or the loads to temporarily increase a current conducted into and/or out of the energy storage apparatus. The controller may initiate the pulse test by changing an operational setting of the powered system. For example, the controller may direct the powered system to change a setting of a traction motor (e.g., motoring), implement regenerative braking using a traction motor, and/or receive a charging current from a wayside device (to charge and/or discharge the battery cells). This may direct a known amount of current directed through (e.g., out of and/or into) one or more modules of the energy storage apparatus for a temporary time period, such as a few milliseconds or seconds.

The controller may then determine a resistance of one or more components of the energy storage apparatus (e.g., a coupling, cell, bus bar, or the like) by measuring the voltage drop across the component(s) being examined while the increased current is conducted through the component(s) during the pulse test. The resistance may be determined by dividing the current by the measured voltage drop. If the calculated resistance increases above a threshold resistance, then the controller may determine that the component(s) have failed, or are in need of repair, inspection, or replacement. Alternatively, the controller may perform the pulse test by applying a known voltage across the component being examined and measuring the current conducted through the component to determine the resistance. If the calculated resistance increases above a threshold resistance, then the controller may determine that the component(s) have failed, or are in need of repair, inspection, or replacement. The known current or voltage that is conducted through or applied to a component being examined may be a ripple current or a ripple voltage (e.g., a current or voltage that changes with respect to time).

Figure 16:
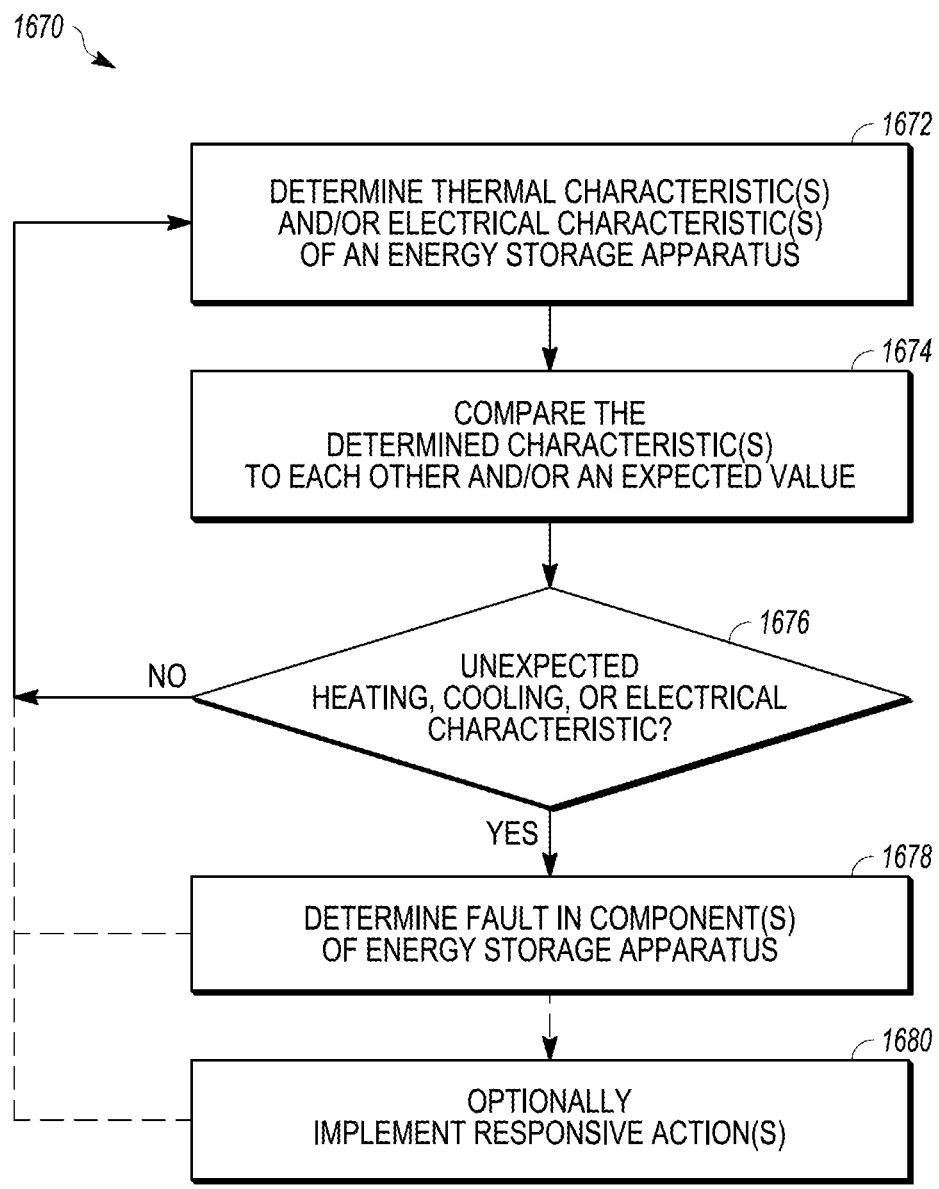
FIG. 16 illustrates one example of a flowchart of a method for determining a fault with or in an energy storage apparatus.

FIG. 16 illustrates one example of a flowchart of a method 1600 for determining a fault with or in an energy storage apparatus. The method may represent one or more operations performed by the monitoring system (e.g., the controller described herein. At step 1672, one or more thermal characteristics and/or electrical characteristics of the energy storage apparatus is or are determined. As described above, the characteristic(s) may be measured by a sensor or estimated (e.g., calculated) by the controller. The characteristic(s) may indicate the thermal and/or electrical characteristic(s) of a component of the energy storage apparatus, such as a battery cell, bus bar, coupling, thermal management system, or the like. At step 1674, the characteristic(s) that is or are determined may be compared with each other and/or an expected value. The expected value may be a designated threshold, such as an absolute or relative threshold, as described herein. Optionally, the expected value may be a characteristic or combined characteristic (e.g., average, median, or the like) of characteristic(s) measured or estimated for one or more other components of the energy storage apparatus. At step 1676, a determination is made as to whether the comparison of the characteristic(s) with the expected value indicate unexpected heating, unexpected cooling, an unexpected electrical resistance, or the like, as described herein. If the characteristic(s) indicate such a health or state of the energy storage apparatus, then flow of the method may proceed toward step 1678. Otherwise, flow of the method may return toward 1 step 672. Alternatively, the method may terminate.

At step 1678, a fault of the energy storage apparatus or a component of the apparatus is determined or identified. For example, if the characteristic(s) exceed a threshold, then the characteristic(s) may indicate a fault of a component in the energy storage apparatus. This fault may be announced to an operator of the powered system, such as by generating a sound, a display, or the like, to inform the operator of the fault. The method may terminate, optionally return toward step 1672, or optionally may proceed toward step 1680. At step 1680, one or more responsive actions may be implemented. For example, the controller may deactivate or turn off a module, string, stack, group, or cell; may deactivate or turn off a load; may notify an operator of a need for repair, inspection, or replacement of a module, string, stack, group, cell, or coupling; may slow or stop movement of the vehicle; or the like. Flow of the method may return toward step 1672 or may terminate.

In one embodiment, a method is provided that may include determining at least one of (a) one or more thermal characteristics of an energy storage apparatus that supplies electric current to one or more vehicular loads for powering the one or more vehicular loads and/or (b) one or more electrical characteristics of the energy storage apparatus or the one or more vehicular loads. The method also may include determining whether operation of the energy storage apparatus indicates that the energy storage apparatus is unexpectedly heating or unexpectedly cooling and identifying a fault in the energy storage apparatus responsive to determining that the energy storage apparatus is unexpectedly heating or unexpectedly cooling.

The one or more thermal characteristics may include one or more of: a cell temperature of a battery cell of the energy storage apparatus, a coupling temperature of a coupling within the energy storage apparatus, an ambient temperature, a busbar temperature, and/or a temperature of a liquid cooling medium. Determining (a) the one or more thermal characteristics and/or (b) the one or more electrical characteristics may include directly measuring a temperature of the energy storage apparatus using one or more sensors.

Determining (a) the one or more thermal characteristics and/or (b) the one or more electrical characteristics may include determining an estimated temperature of the energy storage apparatus based on one or more of: an incoming electric current conducted into the energy storage apparatus, an outgoing electric current conducted out of the energy storage apparatus, an ambient temperature, a measured temperature of one or more other components of the vehicle, and/or a temperature of a liquid cooling medium.

Determining (a) the one or more thermal characteristics and/or (b) the one or more electrical characteristics may include determining an expected temperature of a battery cell of the energy storage apparatus. This expected temperature may be determined based on one or more of a thermal loss of a bus bar of the energy storage apparatus, a thermal capacitance of the bus bar, an ambient thermal resistance between the bus bar and an ambient atmosphere, a component thermal resistance between the bus bar and the energy storage apparatus, a component temperature of the energy storage apparatus, a bus bar temperature of the bus bar, an ambient temperature, a thermal resistance between the battery cell and a liquid cooling medium, a thermal loss between the battery cell and at least one other battery cell, a temperature differential between internal components within a common housing of the energy storage apparatus that are powered by the energy storage apparatus, and/or a temperature differential between shared components that are powered by common current from the energy storage apparatus.

With respect to the thermal loss of the bus bar, this thermal loss may be related to a thermal time constant of the bus bar and an instantaneous wattage of the bus bar while current is conducted via the bus bar. If the temperature is changing faster or slower than expected while the temperature of other (e.g., similar) busbars is changing as expected (or if there is larger instantaneous losses), this may indicate a fault of the energy storage apparatus and may present itself in the busbar measurement or cell temperature estimation.

With respect to the thermal capacitance of the bus bar, this capacitance may be related to the thermal time constant of the busbar and the heat storage capabilities of the bus bar. If the temperature is changing faster or slower than expected and the temperature of other (e.g., similar) busbars is changing as expected, this may indicate a fault and may present itself in the busbar measurement or cell temperature estimation.

With respect to the thermal resistance between the bus bar and ambient atmosphere, which may be related to the impact of the ambient atmosphere on the measured temperature. If no current is being conducted via the bus bar but the ambient temperature is changing, the bus bar temperature and the cell temperature should change as well to meet the change in the ambient temperature. If the bus bar temperature and/or cell temperature do not change with the changing ambient temperature, then this may indicate a fault in the energy storage apparatus.

With respect to the component temperature, this may be the temperature of a busbar or other similar component (e.g., a fuse near a sensor, etc.) that may add heat into the system. Similar to the busbar, there are expected characteristics of the component (based on material, geometry, and the like) which will impact the thermal model of the cell. If there is a fault with the component, the cell temperature will deviate from what would be the expected temperature and/or the temperatures of other cells.

With respect to the bus bar temperature, this temperature may be compared to the temperature of other busbars or an expected change of the busbar temperature to determine whether a failure has occurred.

With respect to the ambient temperature, this temperature may be compared to other busbar temperatures at steady state or other ambient temperatures to determine whether a failure has occurred.

With respect to the thermal resistance between the battery cell and a liquid cooling medium, this resistance may be related to the impact of the ambient atmosphere on the measured temperature. If no current is being conducted into or out of the battery cell but the ambient temperature is changing, the cell temperature should change as well to meet the change in the ambient temperature. If the cell temperature does not change with the changing ambient temperature, then this may indicate a fault in the energy storage apparatus.

With respect to the thermal loss between a battery cell and at least one other battery cell, the cells are coupled together and should share heat between or among the cells. If one cell is warmer than other nearby (e.g., neighboring or adjacent) cells, this may indicate a sensor failure. If one cell is warmer or increasing in temperature (more than expected) and other nearby cells also are increasing in temperature, this may indicate a failure in the powered system or energy storage apparatus.

With respect to the temperature differential between internal components within a common housing, the temperatures of these components (e.g., battery cells, bus bars, etc.) should be within an expected gradient or threshold amount of each other. Otherwise, the temperatures may indicate a failure of the energy storage apparatus (or a component thereof).

The one or more electrical characteristics may include an incoming current being conducted into the energy storage apparatus, an outgoing current being conducted out of the energy storage apparatus to the one or more vehicular loads, an incoming voltage being conducted into the energy storage apparatus, an outgoing voltage being conducted out of the energy storage apparatus to the one or more vehicular loads, an internal resistance of one or more battery cells of the energy storage apparatus, an external resistance within the energy storage apparatus but outside of the one or more battery cells of the energy storage apparatus, an incoming power being conducted into the energy storage apparatus, an outgoing power being conducted out of the energy storage apparatus to the one or more vehicular loads, and/or an electric energy stored within the energy storage apparatus. With respect to the incoming or outgoing current or power, components are expected to change temperature with current or power being conducted due to I2R losses. If current or power is applied to a component, but the temperature of the component is not changing, there could be a connection failure or sensor failure in the circuit. The change should also be proportional to the square of the current. If incoming and outgoing currents do not match each other, there could be a short or some other failure in the system.

With respect to the incoming or outgoing voltage, the voltage applied to the terminals of a battery may be tied to current conducted in the system and resistance of the system. FIG. 12 is one example of voltage on each battery cell. The voltage drop alone may indicate that a failure is in the system as described above. This drop could indicate a failure in an external or internal resistance.

With respect to the internal resistance of one or more battery cells, if the internal resistance of one or more cells is greater than one or more other cells, than the temperature of that cell will increase faster than the other cells. A disconnection of a cell in parallel or failures in uniform aging may be detected by extra heat in cell groups compared to other cell groups. Optionally, a pulse test may be used to determine internal resistances and comparing the resistances to absolute resistance thresholds and/or to compare resistances of different cell groups with each other to identify faults.

With respect to the external resistance within the energy storage apparatus but outside of the battery cells, if a voltage sensor is measuring the cell voltage and the component voltage, then measurements from several voltage sensors may be compared to determine external resistances in the system.

Determining the one or more electrical characteristics may include determining an expected wattage of electric current supplied by the energy storage apparatus based on one or more of: a temperature of the energy storage apparatus, a thermal loss of the energy storage apparatus, a thermal capacitance of the energy storage apparatus, a thermal resistance between the energy storage apparatus and an ambient atmosphere, and/or a thermal resistance between one or more battery cells of the energy storage apparatus and a liquid cooling medium.

Determining whether operation of the energy storage apparatus deviates from the expected parameter and indicates that the energy storage apparatus is unexpectedly heating or unexpectedly cooling may include comparing a measured or estimated wattage of the electric current supplied by the energy storage apparatus with the expected wattage of the electric current supplied by the energy storage apparatus, and determining that the operation of the energy storage apparatus deviates from the expected parameter and that the operation indicates that the energy storage apparatus is unexpectedly heating or unexpectedly cooling responsive to the measured or estimated wattage deviating from the expected wattage by at least a threshold amount.

The expected parameter may be estimated based on the one or more thermal characteristics, the one or more electrical characteristics, or a combination of the one or more thermal characteristics and the one or more electrical characteristics.

The expected parameter is a measured value of the one or more thermal characteristics, the one or more electrical characteristics, or a combination of the one or more thermal characteristics and the one or more electrical characteristics.

The expected parameter may include one or more of: an expected temperature of one or more battery cells of the energy storage apparatus, an expected resistance of the energy storage apparatus or of one or more battery cells of the energy storage apparatus, an expected power conducted into or out of the energy storage apparatus, or an expected electric energy stored within the energy storage apparatus.

Determining whether the expected parameter indicates that the energy storage apparatus is unexpectedly heating or unexpectedly cooling may be performed by comparing the expected parameter for each of plural, repeated components of the energy storage apparatus with each other.

Determining whether the expected parameter indicates that the energy storage apparatus is unexpectedly heating or unexpectedly cooling includes determining that the expected parameters of the plural, repeated components indicate unexpected heating or unexpected cooling for the plural, repeated components, and determining that the plural, repeated components are coupled with a common external component that is external to the energy storage apparatus, where the fault is determined to be within the common external component.

The fault may be one or more of: a loose or deteriorated mechanical coupling of the energy storage apparatus, the one or more vehicular loads, or a connection between the energy storage apparatus and the one or more vehicular loads; a failed internal battery cell within the energy storage apparatus; and/or a failed thermal management circuit that operates to cool or heat the energy storage apparatus or another component of the vehicle.

The method also may include one or more of discharging electric current from or charging electric current to the energy storage apparatus, where the one or more thermal characteristics, the one or more electrical characteristics, or both the one or more thermal characteristics and the one or more electrical characteristics are determined during or subsequent to the one or more of discharging or charging the electric current.

Determining the one or more thermal characteristics of the energy storage apparatus may include measuring temperatures of multiple interchangeable electronic modules in a housing for the electronic supply component. Determining the expected parameter may include comparing the temperatures of the modules with each other. Determining whether operation of the energy storage apparatus deviates from the expected parameter and indicates that the energy storage apparatus is unexpectedly heating or unexpectedly cooling may include determining whether at least two of the temperatures differ by at least a threshold amount within a common packaging component. The fault in the energy storage apparatus may be determined to be within an identified module of the modules associated with the temperature that differs from at least one other of the temperatures by at least the threshold amount.

Determining the one or more thermal characteristics of the energy storage apparatus may include measuring temperatures of multiple interchangeable electronic modules that share a common thermal management circuit or coolant. Determining the expected parameter may include comparing the temperatures of the modules with each other. Determining whether operation of the energy storage apparatus deviates from the expected parameter and indicates that the energy storage apparatus is unexpectedly heating or unexpectedly cooling may include determining whether the temperatures do not differ from each other by at least a threshold amount but that differ from an expected temperature. The fault in the energy storage apparatus may be determined to be within an external thermal management circuit that operates to heat or cool the modules responsive to the temperatures not differing from each other by at least the threshold amount but that differ from the expected temperature.

In one embodiment, a method includes determining a first temperature of a first battery cell group formed from a first group of one or more battery cells connected with each other, determining a second temperature of at least a second battery cell group formed from a second group of one or more battery cells connected in parallel with each other, determining whether one or more of the first temperature or a rate of change of the first temperature of the first battery cell group exceeds a first threshold and one or more of the second temperature or a rate of change of the second temperature of the second battery cell group exceeds a second threshold, and, responsive to determining that either the first temperature of the first battery cell group exceeds the first threshold or the second temperature of the second battery cell group exceeds the second threshold, identifying a thermal runaway of the first module in the module string.

The method also may include determining one or more of a sensor fault, a measurement error, or a processing failure responsive to determining that the first temperature exceeds the first threshold, and the second temperature does not exceed the second threshold. The first temperature, the second temperature, or both the first temperature and the second temperature may be estimated based on: an incoming electric current conducted into the first battery cell group, the second battery cell group, or both the first and second battery cell groups, an outgoing electric current conducted out of the first battery cell group, the second battery cell group, or both the first and second battery cell groups, or an ambient temperature.

In one embodiment, a method includes determining whether a first temperature increase in a first group of battery cells of an energy storage apparatus onboard a vehicle is greater than a first threshold, determining whether a temperature rise differential between a first battery cell of the battery cells in the first group and one or more other battery cells of the battery cells in the first group, determining whether the temperature rise differential is greater than a second threshold, determining whether at least a second temperature increase of at least a second battery cell in at least a second group of the battery cells is greater than a third threshold (where the first battery cell and the at least the second battery cell are each located in the same position within each of the first group of the battery cells and the at least the second group of the battery cells), and determining that a thermal runaway has occurred or is occurring within the energy storage apparatus responsive to the first temperature increase exceeding the first threshold, the temperature differential exceeds the second threshold, and the second temperature increase exceeds the third threshold.

Responsive to determining that the thermal runaway has occurred or is occurring, the method may include one or more of: restricting operation of a string of modules that includes the first group of the battery cells and the at least the second group of the battery cells, activating a thermal management circuit to cool the first group of the battery cells and the at least the second group of the battery cells, terminating load balancing of the battery cells, activating a fire suppression system, and/or activating an exhaust blower.

The method also may include selecting from among restricting a string of modules that includes the battery cells from operation, activating the thermal management circuit, balancing the load, activating the fire suppression system, or activating the exhaust blower based on a magnitude by which the first temperature increase exceeds the first threshold.

In one embodiment, a method includes measuring one or more of a temperature, resistance, or voltage at or within a designated distance of a coupling between an energy storage apparatus that supplies electric current to one or more vehicular loads for powering the one or more vehicular loads, and determining a failure of the coupling based on the one or more of the temperature, the resistance, or the voltage that is measured.

The coupling may be a first coupling of plural couplings, where the one or more of the temperature, the resistance, or the voltage may be measured for at least two of the couplings of the energy storage apparatus, and, where the failure of the first coupling is determined responsive to a difference between (a) the one or more of the temperature, the resistance, or the voltage that is measured or estimated for the first coupling and (b) the one or more of the temperature, the resistance, or the voltage that are measured for one or more other couplings exceeding a threshold.

In one embodiment, a method includes pulsing one or more of a current or a voltage through one or more couplings between components of an energy storage apparatus, determining a change in resistance of the one or more couplings, and determining that the one or more couplings are one or more of loose or damaged based on the change in resistance of the one or more couplings.

The one or more couplings may include one or more bolts or welds in the energy storage apparatus. The one or more of the current or the voltage may be pulsed through the one or more couplings during different operating modes of a vehicle that includes the energy storage apparatus. The different operating modes may include motoring by the vehicle, regenerative braking by the vehicle, or wayside charging of the energy storage apparatus.

In one or more embodiments, a sensor may disposed on or near a coupling of the energy storage apparatus and may sense both a temperature of a battery cell of the energy storage apparatus and a temperature of the coupling. The sensor may be disposed near the coupling by the sensor being closer to the coupling than the battery cell. The sensor may not be disposed on the battery cell.

In one embodiment, the monitoring system and/or controller may have a local data collection system deployed that may use machine learning to enable derivation-based learning outcomes. The controller may learn from and make decisions on a set of data (including data provided by the various sensors), by making data-driven predictions and adapting according to the set of data. In embodiments, machine learning may involve performing a plurality of machine learning tasks by machine learning systems, such as supervised learning, unsupervised learning, and reinforcement learning. Supervised learning may include presenting a set of example inputs and desired outputs to the machine learning systems. Unsupervised learning may include the learning algorithm structuring its input by methods such as pattern detection and/or feature learning. Reinforcement learning may include the machine learning systems performing in a dynamic environment and then providing feedback about correct and incorrect decisions. In examples, machine learning may include a plurality of other tasks based on an output of the machine learning system. In examples, the tasks may be machine learning problems such as classification, regression, clustering, density estimation, dimensionality reduction, anomaly detection, and the like. In examples, machine learning may include a plurality of mathematical and statistical techniques. In examples, the many types of machine learning algorithms may include decision tree based learning, association rule learning, deep learning, artificial neural networks, genetic learning algorithms, inductive logic programming, support vector machines (SVMs), Bayesian network, reinforcement learning, representation learning, rule-based machine learning, sparse dictionary learning, similarity and metric learning, learning classifier systems (LCS), logistic regression, random forest, K-Means, gradient boost, K-nearest neighbors (KNN), a priori algorithms, and the like. In embodiments, certain machine learning algorithms may be used (e.g., for solving both constrained and unconstrained optimization problems that may be based on natural selection). In an example, the algorithm may be used to address problems of mixed integer programming, where some components restricted to being integer-valued. Algorithms and machine learning techniques and systems may be used in computational intelligence systems, computer vision, Natural Language Processing (NLP), recommender systems, reinforcement learning, building graphical models, and the like. In an example, machine learning may be used for vehicle performance and behavior analytics, and the like.

In one embodiment, the monitoring system and/or controller may include a policy engine that may apply one or more policies. These policies may be based at least in part on characteristics of a given item of equipment or environment. With respect to control policies, a neural network can receive input of a number of environmental and task-related parameters. These parameters may include an identification of a determined trip plan for a vehicle group, data from various sensors, and location and/or position data. The neural network can be trained to generate an output based on these inputs, with the output representing an action or sequence of actions that the vehicle group should take to accomplish the trip plan. During operation of one embodiment, a determination can occur by processing the inputs through the parameters of the neural network to generate a value at the output node designating that action as the desired action. This action may translate into a signal that causes the vehicle to operate. This may be accomplished via back-propagation, feed forward processes, closed loop feedback, or open loop feedback. Alternatively, rather than using backpropagation, the machine learning system of the controller may use evolution strategies techniques to tune various parameters of the artificial neural network. The monitoring system and/or controller may use neural network architectures with functions that may not always be solvable using backpropagation, for example functions that are non-convex. In one embodiment, the neural network has a set of parameters representing weights of its node connections. A number of copies of this network are generated and then different adjustments to the parameters are made, and simulations are done. Once the output from the various models are obtained, they may be evaluated on their performance using a determined success metric. The best model is selected, and the vehicle controller executes that plan to achieve the desired input data to mirror the predicted best outcome scenario. Additionally, the success metric may be a combination of the optimized outcomes, which may be weighed relative to each other.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A method comprising:
   determining at least one of:
   (a) one or more thermal characteristics of an energy storage apparatus that supplies electric current to one or more vehicular loads for powering the one or more vehicular loads, the one or more thermal characteristics including at least one of a first temperature of a bolt or weld within the energy storage apparatus, a second temperature of a busbar, or a third temperature of a liquid cooling medium, or
   (b) one or more electrical characteristics of the energy storage apparatus or the one or more vehicular loads;
   determining whether operation of the energy storage apparatus indicates that the energy storage apparatus is unexpectedly heating or unexpectedly cooling based on the at least one of (a) the one or more thermal characteristics or (b) the one or more electrical characteristics;
identifying a fault in the energy storage apparatus responsive to determining that the energy storage apparatus is unexpectedly heating or unexpectedly cooling; and
responsive to identifying the fault, one or more of:
activating a thermal management circuit to cool the energy storage apparatus,
terminating load balancing of the energy storage apparatus,
activating a fire suppression system, or
activating an exhaust blower.

2. The method of claim 1, wherein determining the at least one of (a) the one or more thermal characteristics or (b) the one or more electrical characteristics includes directly measuring a fourth temperature of the energy storage apparatus using one or more sensors.

3. The method of claim 1, wherein determining the at least one of (a) the one or more thermal characteristics or (b) the one or more electrical characteristics includes determining an estimated temperature of the energy storage apparatus based on one or more of: an incoming electric current conducted into the energy storage apparatus, an outgoing electric current conducted out of the energy storage apparatus, a measured temperature of one or more other components of a vehicle, or a temperature of a liquid cooling medium.

4. The method of claim 1, wherein determining the at least one of (a) the one or more thermal characteristics or (b) the one or more electrical characteristics includes determining an expected temperature of a battery cell of the energy storage apparatus based on one or more of:
a thermal loss of a bus bar of the energy storage apparatus,
a thermal capacitance of the bus bar, an ambient thermal resistance between the bus bar and an ambient atmosphere,
a component thermal resistance between the bus bar and the energy storage apparatus,
a component temperature of the energy storage apparatus,
a bus bar temperature of the bus bar,
an ambient temperature,
a thermal resistance between the battery cell and a liquid cooling medium, a thermal loss between the battery cell and at least one other battery cell,
a temperature differential between internal components within a common housing of the energy storage apparatus that are powered by the energy storage apparatus, or
a temperature differential between shared components that are powered by common current from the energy storage apparatus.

5. The method of claim 1, wherein the one or more electrical characteristics are determined and include one or more of:
an incoming current being conducted into the energy storage apparatus,
an outgoing current being conducted out of the energy storage apparatus to the one or more vehicular loads,
an incoming voltage being conducted into the energy storage apparatus,
an outgoing voltage being conducted out of the energy storage apparatus to the one or more vehicular loads,
an internal resistance of one or more battery cells of the energy storage apparatus,
an external resistance within the energy storage apparatus but outside of the one or more battery cells of the energy storage apparatus,
an incoming power being conducted into the energy storage apparatus,
an outgoing power being conducted out of the energy storage apparatus to the one or more vehicular loads, or
an electric energy stored within the energy storage apparatus.

6. The method of claim 1, wherein the one or more electrical characteristics are determined, and the one or more electrical characteristics are determined by determining an expected wattage of electric current supplied by the energy storage apparatus based on one or more of: a temperature of the energy storage apparatus, a thermal loss of the energy storage apparatus, a thermal capacitance of the energy storage apparatus, a thermal resistance between the energy storage apparatus and an ambient atmosphere, or a thermal resistance between one or more battery cells of the energy storage apparatus and a liquid cooling medium.

7. The method of claim 6, wherein determining whether the operation of the energy storage apparatus indicates that the energy storage apparatus is unexpectedly heating or unexpectedly cooling includes:
comparing a measured or estimated wattage of the electric current supplied by the energy storage apparatus with the expected wattage of the electric current supplied by the energy storage apparatus; and
determining that the operation of the energy storage apparatus deviates from the expected wattage and that the operation indicates that the energy storage apparatus is unexpectedly heating or unexpectedly cooling responsive to the measured or estimated wattage deviating from the expected wattage by at least a threshold amount.

8. The method of claim 1, wherein the fault is identified to be one or more of:
a loose or deteriorated mechanical coupling of the energy storage apparatus, the one or more vehicular loads, or a connection between the energy storage apparatus and the one or more vehicular loads; or
a failed internal battery cell within the energy storage apparatus.

9. The method of claim 1, wherein the operation of the energy storage apparatus is determined to indicate that the energy storage apparatus is unexpectedly heating or unexpectedly cooling by comparing the one or more thermal characteristics or (b) the one or more electrical characteristics with an expected parameter.

10. The method of claim 9, further comprising:
estimating the expected parameter based on the one or more thermal characteristics, the one or more electrical characteristics, or a combination of the one or more thermal characteristics and the one or more electrical characteristics.

11. The method of claim 9, wherein the expected parameter is a measured value of the one or more thermal characteristics, the one or more electrical characteristics, or a combination of the one or more thermal characteristics and the one or more electrical characteristics.

12. The method of claim 9, wherein the expected parameter includes one or more of: an expected temperature of one or more battery cells of the energy storage apparatus, an expected resistance of the energy storage apparatus or of one or more battery cells of the energy storage apparatus, an expected power conducted into or out of the energy storage apparatus, or an expected electric energy stored within the energy storage apparatus.

13. The method of claim 9, wherein determining whether the operation of the energy storage apparatus is unexpectedly heating or unexpectedly cooling is performed by comparing the expected parameter for each of plural, repeated components of the energy storage apparatus with each other.

14. The method of claim 13, wherein determining whether the operation of the energy storage apparatus indicates that the energy storage apparatus is unexpectedly heating or unexpectedly cooling includes:
   determining that the expected parameters of the plural, repeated components indicate unexpected heating or unexpected cooling for the plural, repeated components; and
   determining that the plural, repeated components are coupled with a common external joint that is external to the energy storage apparatus,
   wherein the fault is determined to be within the common external joint.

15. A method comprising:
   determining a first temperature of a first battery cell group formed from a first group of battery cells connected with each other;
   determining a second temperature of at least a second battery cell group formed from a second group of the battery cells connected in parallel with each other;
   determining whether one or more of the first temperature or a rate of change of the first temperature of the first battery cell group exceeds a first threshold and one or more of the second temperature or a rate of change of the second temperature of the second battery cell group exceeds a second threshold;
   responsive to determining that either (a) the first temperature or the rate of change of the first battery cell group exceeds the first threshold or (b) the second temperature or the rate of change of the second battery cell group exceeds the second threshold, identifying a thermal runaway of the first battery cell group; and
   responsive to identifying the thermal runaway, one or more of:
      activating a thermal management circuit to cool the first battery cell group, the second battery cell group, or both the first battery cell group and the second battery cell group,
      terminating load balancing of the first battery cell group, the second battery cell group, or both the first battery cell group and the second battery cell group,
      activating a fire suppression system, or
      activating an exhaust blower.

16. The method of claim 15, further comprising determining one or more of a sensor fault, a measurement error, or a processing failure responsive to determining that the first temperature exceeds the first threshold and the second temperature does not exceed the second threshold.

17. The method of claim 15, wherein the first temperature, the second temperature, or both the first temperature and the second temperature are determined based on:
   an incoming electric current conducted into the first battery cell group, the second battery cell group, or both the first and second battery cell groups, or
   an outgoing electric current conducted out of the first battery cell group, the second battery cell group, or both the first and second battery cell groups.

18. A method comprising:
   determining whether a first temperature increase in a first group of battery cells of an energy storage apparatus is greater than a first threshold;
   determining whether a temperature rise differential between a first battery cell of the battery cells in the first group and one or more other battery cells of the battery cells in the first group is greater than a second threshold;
   determining whether at least a second temperature increase of at least a second battery cell in at least a second group of the battery cells is greater than a third threshold, wherein the first battery cell and the at least the second battery cell are each located in the same position within each of the first group of the battery cells and the at least the second group of the battery cells;
   determining that a thermal runaway has occurred or is occurring within the energy storage apparatus responsive to the first temperature increase exceeding the first threshold, the temperature differential exceeds the second threshold, and the second temperature increase exceeds the third threshold; and
   responsive to determining that the thermal runaway has occurred or is occurring, one or more of:
      restricting operation of a string of modules that includes the first group of the battery cells and the at least the second group of the battery cells,
      activating a thermal management circuit to cool the first group of the battery cells and the at least the second group of the battery cells,
      terminating load balancing of the battery cells,
      activating a fire suppression system, or
      activating an exhaust blower.

19. The method of claim 18, further comprising selecting from among restricting a string of modules that includes the battery cells from operation, activating the thermal management circuit, balancing the load, activating the fire suppression system, or activating the exhaust blower based on a magnitude by which the first temperature increase exceeds the first threshold.

* * * * *